US009245589B2

(12) United States Patent
Aoki et al.

(10) Patent No.: US 9,245,589 B2
(45) Date of Patent: Jan. 26, 2016

(54) SEMICONDUCTOR DEVICE HAVING SCHMITT TRIGGER NAND CIRCUIT AND SCHMITT TRIGGER INVERTER

(71) Applicant: SEMICONDUCTOR ENERGY LABORATORY CO., LTD., Atsugi-Shi, Kanagawa-Ken (JP)

(72) Inventors: Takeshi Aoki, Kanagawa (JP); Yoshiyuki Kurokawa, Kanagawa (JP); Munehiro Kozuma, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 57 days.

(21) Appl. No.: 14/217,793

(22) Filed: Mar. 18, 2014

(65) Prior Publication Data

US 2014/0286076 A1    Sep. 25, 2014

(30) Foreign Application Priority Data

Mar. 25, 2013    (JP) ................................. 2013-061969

(51) Int. Cl.
  *G11C 5/06*    (2006.01)
  *G11C 7/10*    (2006.01)
(52) U.S. Cl.
  CPC ................ *G11C 5/06* (2013.01); *G11C 7/1051* (2013.01); *G11C 7/1057* (2013.01)
(58) Field of Classification Search
  CPC .... G11C 7/106; G11C 7/1051; G11C 7/1057; G11C 7/1078; G11C 11/412; G11C 11/4097; G11C 5/06

USPC .......................... 365/72, 189.05, 205, 230.08
See application file for complete search history.

(56) References Cited

U.S. PATENT DOCUMENTS

| 3,775,693 A | 11/1973 | Proebsting |
| 4,797,576 A | 1/1989 | Asazawa |
| 4,800,303 A | 1/1989 | Graham et al. |
| 4,809,225 A | 2/1989 | Dimmler et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tha-O H Bui
(74) *Attorney, Agent, or Firm* — Fish & Richardson P.C.

(57) ABSTRACT

A nonvolatile semiconductor device which can be driven at low voltage is provided. A nonvolatile semiconductor device with low power consumption is provided. A Schmitt trigger NAND circuit and a Schmitt trigger inverter are included. Data is held in a period when the supply of power supply voltage is continued, and a potential corresponding to the data is stored at a node electrically connected to a capacitor before a period when the supply of power supply voltage is stopped. By utilizing a change in channel resistance of a transistor whose gate is connected to the node, the data is restored in response to the restart of the supply of power supply voltage.

18 Claims, 17 Drawing Sheets

(56) References Cited

U.S. PATENT DOCUMENTS

| | | | |
|---|---|---|---|
| 5,039,883 A | 8/1991 | On | |
| 5,473,571 A | 12/1995 | Shigematsu et al. | |
| 5,731,856 A | 3/1998 | Kim et al. | |
| 5,744,864 A | 4/1998 | Cillessen et al. | |
| 5,936,879 A | 8/1999 | Brouwer et al. | |
| 5,980,092 A | 11/1999 | Merryman et al. | |
| 6,049,883 A | 4/2000 | Tjandrasuwita | |
| 6,078,194 A | 6/2000 | Lee | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,556,475 B2 | 4/2003 | Yamazaki et al. | |
| 6,563,174 B2 | 5/2003 | Kawasaki et al. | |
| 6,573,754 B2 | 6/2003 | Menczigar et al. | |
| 6,693,616 B2 | 2/2004 | Koyama et al. | |
| 6,727,522 B1 | 4/2004 | Kawasaki et al. | |
| 6,738,281 B2 | 5/2004 | Yokozeki | |
| 6,788,567 B2 | 9/2004 | Fujimori | |
| 6,909,411 B1 | 6/2005 | Yamazaki et al. | |
| 6,975,298 B2 | 12/2005 | Koyama et al. | |
| 7,019,999 B1 | 3/2006 | Srinivasan et al. | |
| 7,031,189 B2 | 4/2006 | Pascucci | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2 | 7/2006 | Kapoor et al. | |
| 7,105,868 B2 | 9/2006 | Nause et al. | |
| 7,151,511 B2 | 12/2006 | Koyama | |
| 7,158,157 B2 | 1/2007 | Yamazaki et al. | |
| 7,211,825 B2 | 5/2007 | Shih et al | |
| 7,224,339 B2 | 5/2007 | Koyama et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,471,580 B2 | 12/2008 | Henzler et al. | |
| 7,501,293 B2 | 3/2009 | Ito et al. | |
| 7,557,801 B2 | 7/2009 | Ozaki | |
| 7,576,582 B2 | 8/2009 | Lee et al. | |
| 7,674,650 B2 | 3/2010 | Akimoto et al. | |
| 7,696,952 B2 | 4/2010 | Kimura et al. | |
| 7,732,819 B2 | 6/2010 | Akimoto et al. | |
| 7,863,627 B2 | 1/2011 | Honda | |
| 7,910,490 B2 | 3/2011 | Akimoto et al. | |
| 7,932,521 B2 | 4/2011 | Akimoto et al. | |
| 8,212,248 B2 | 7/2012 | Itagaki et al. | |
| 8,274,077 B2 | 9/2012 | Akimoto et al. | |
| 8,314,637 B2 | 11/2012 | Kato et al. | |
| 8,362,538 B2 | 1/2013 | Koyama et al. | |
| 8,368,066 B2 | 2/2013 | Yamazaki et al. | |
| 8,410,838 B2 | 4/2013 | Kato et al. | |
| 8,432,187 B2 | 4/2013 | Kato et al. | |
| 8,446,171 B2 | 5/2013 | Takahashi | |
| 8,605,490 B2 | 12/2013 | Fackenthal | |
| 8,619,464 B1 | 12/2013 | Sinha et al. | |
| 8,638,594 B1 | 1/2014 | Sinha et al. | |
| 8,792,275 B2 | 7/2014 | Shih et al. | |
| 8,817,536 B2 | 8/2014 | Scade et al. | |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0074568 A1 | 6/2002 | Yoshida et al. | |
| 2002/0132454 A1 | 9/2002 | Ohtsu et al. | |
| 2003/0076282 A1 | 4/2003 | Ikeda et al. | |
| 2003/0122581 A1 | 7/2003 | Inoue et al. | |
| 2003/0123313 A1* | 7/2003 | Hanzawa | G11C 11/4099 365/210.1 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 | 6/2006 | Dronavalli | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0019460 A1 | 1/2007 | Kang et al. | |
| 2007/0024187 A1 | 2/2007 | Shin et al. | |
| 2007/0024318 A1 | 2/2007 | Mamidipaka | |
| 2007/0046191 A1* | 3/2007 | Saito | H01L 27/1248 313/506 |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0126666 A1 | 6/2007 | Yamazaki et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0170028 A1 | 7/2008 | Yoshida | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2009/0002044 A1 | 1/2009 | Kobayashi | |
| 2009/0008639 A1 | 1/2009 | Akimoto et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |

(56) References Cited

U.S. PATENT DOCUMENTS

| | | |
|---|---|---|
| 2009/0280600 A1 | 11/2009 | Hosono et al. |
| 2009/0305461 A1 | 12/2009 | Akimoto et al. |
| 2010/0019839 A1 | 1/2010 | Monden |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0102018 A1 | 5/2011 | Shionoiri et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0121878 A1 | 5/2011 | Kato et al. |
| 2011/0148463 A1 | 6/2011 | Kato et al. |
| 2011/0156024 A1 | 6/2011 | Koyama et al. |
| 2011/0163311 A1 | 7/2011 | Akimoto et al. |
| 2011/0176357 A1 | 7/2011 | Koyama et al. |
| 2011/0187410 A1 | 8/2011 | Kato et al. |
| 2011/0249487 A1 | 10/2011 | Saito et al. |
| 2012/0033510 A1 | 2/2012 | Nagatsuka et al. |
| 2012/0250397 A1 | 10/2012 | Ohmaru |
| 2012/0250407 A1 | 10/2012 | Kurokawa |
| 2012/0269013 A1 | 10/2012 | Matsuzaki |
| 2012/0294102 A1 | 11/2012 | Ishizu |
| 2013/0057315 A1 | 3/2013 | Kato et al. |
| 2013/0127497 A1 | 5/2013 | Koyama |
| 2013/0135943 A1 | 5/2013 | Ohmaru |
| 2013/0222033 A1 | 8/2013 | Kato et al. |
| 2014/0126271 A1 | 5/2014 | Aoki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 | 4/1993 |
| JP | 05-251705 A | 9/1993 |
| JP | 08-264794 A | 10/1996 |
| JP | 10-078836 A | 3/1998 |
| JP | 11-505377 | 5/1999 |
| JP | 2000-044236 A | 2/2000 |
| JP | 2000-077982 | 3/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 | 2/2006 |
| JP | 2012-217158 A | 11/2012 |
| JP | 2013-008437 A | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Eletron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 20009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 34, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, Vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

OHara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

OHara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/057948) Dated Jun. 3, 2014.

Written Opinion (Application No. PCT/JP2014/057948) Dated Jun. 3, 2014.

Sanghun Jeon et al.; "180nm Gate Length Amorphous InGaZnO Thin Film Transistor for High Density Image Sensor Applications"; IEDM 10: Technical Digest of International Electron Devices Meeting; pp. 504-507; Dec. 6, 2010.

Ihun Song et al.; "Short Channel Characteristics of Gallium—Indium—Zinc—Oxide Thin Film Transistors for Three Dimensional Stacking Memory"; IEEE Electron Device Letters, vol. 29, No. 6; pp. 549-552; Jun. 1, 2008.

Shunpei Yamazaki et al.; "Research, Development, and Application of Crystalline Oxide Semiconductor"; SID Digest '12 : SID International Symposium Digest of Technical Papers; pp. 183-186; Jun. 5, 2012.

Tatsuji Nishijima et al.; "Low-power Display System Driven by Utilizing Technique Using Crystalline IGZO Transistor"; SID Digest '12 : SID International Symposium Digest of Technical Papers; pp. 583-586; 2012.

Shoji Shukuri et al.; "A Complementary Gain Cell Technology for Sub-1V Supply DRAMs"; IEDM 92: Technical Digest of International Electron Devices Meeting; pp. 1006-1008; Dec. 13, 1992.

Shoji Shukuri et al.; "A Semi-Static Complementary Gain Cell Technology for Sub-1 V Supply DRAM's"; IEEE Transactions on Electron Devices, vol. 41, No. 6; pp. 926-931; Jun. 1, 1994.

Wonchan Kim et al.; "An Experimental High-Density DRAM Cell with a Built-in Gain Stage"; IEEE Journal of Solid-State Circuits, vol. 29, No. 8; pp. 978-981; Aug. 1, 1994.

Ki Chil Chun et al.; "A 3T Gain Cell Embedded DRAM Utilizing Preferential Boosting for High Density and Low Power On-Die Caches"; IEEE Journal of Solid-State Circuits, vol. 46, No. 6; pp. 1495-1505; Jun. 1, 2011.

T. Naito et al.; "World's first monolithic 3D-FPGA with TFT SRAM over 90nm 9 layer Cu CMOS"; 2010 Symposium on VLSI Technology : Digest of Technical Papers; pp. 219-220; Jun. 15, 2010.

Tomoyuki Ishii et al.; "A Poly-Silicon TFT With a Sub-5-nm Thick Channel for Low-Power Gain Cell Memory in Mobile Applications"; IEEE Transactions on Electron Devices, vol. 51, No. 11; pp. 1805-1810; Nov. 1, 2004.

Niklas Lotze et al.; "A 62 mV 0.13 μm CMOS Standard-Cell-Based Design Technique Using Schmitt-Trigger Logic"; IEEE Journal of Solid-State Circuits, vol. 47, No. 1; pp. 47-60; 2012.

\* cited by examiner

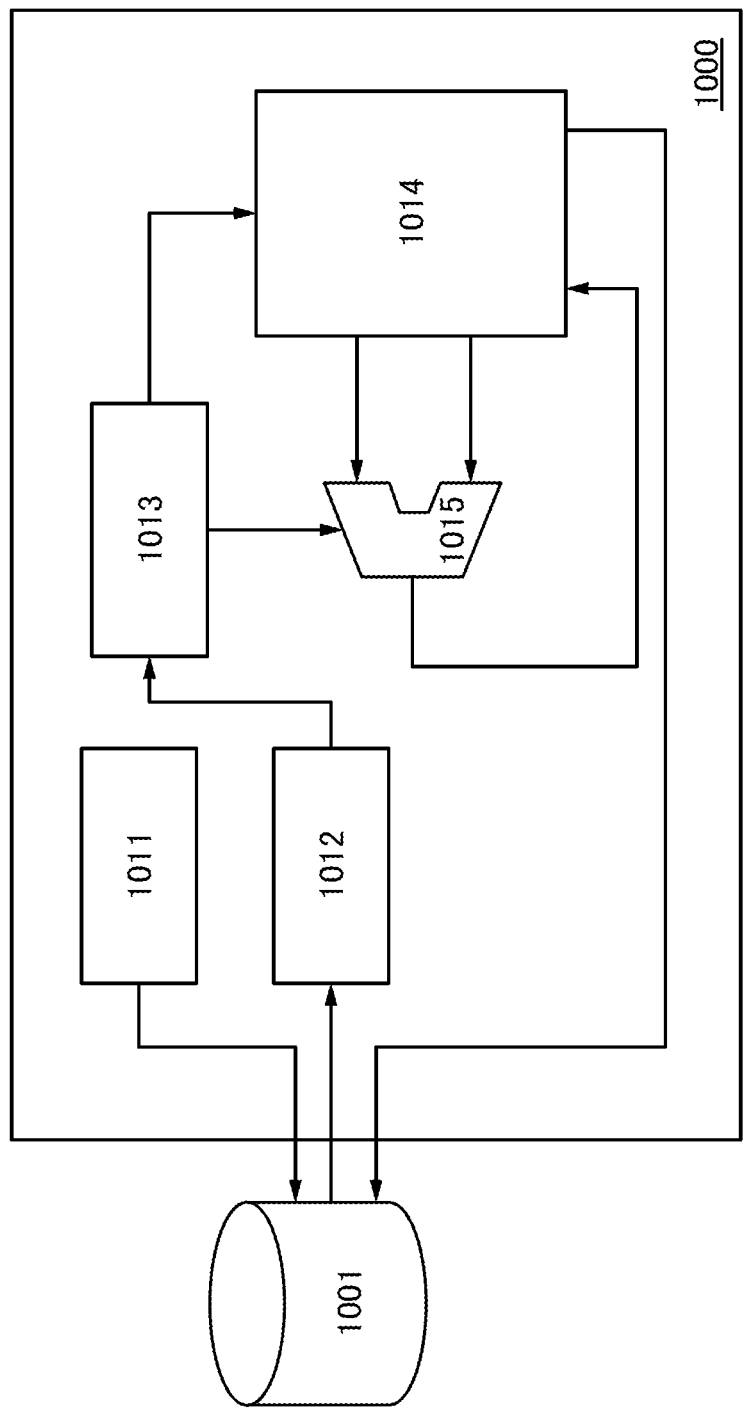

SEMICONDUCTOR DEVICE HAVING SCHMITT TRIGGER NAND CIRCUIT AND SCHMITT TRIGGER INVERTER

TECHNICAL FIELD

The present invention relates to a semiconductor device. The present invention particularly relates to a semiconductor device in which the supply of power supply voltage is stopped as appropriate.

Note that in this specification, a semiconductor device means a device including a semiconductor element or a circuit including a semiconductor element.

BACKGROUND ART

A semiconductor device such as a programmable logic device (PLD) or a central processing unit (CPU) has a variety of configurations depending on its application. The semiconductor device generally includes a memory device; the PLD includes a register and a configuration memory, and the CPU includes a register and a cache memory.

These memory devices need to operate at higher speed in writing and reading data than a main memory for which a DRAM is generally used. Thus, in many cases, a flip-flop is used as a register, and a static random access memory (SRAM) is used as a configuration memory and a cache memory.

The SRAM achieves high-speed operation with miniaturization of a transistor; however, there is a problem in that as the transistor is miniaturized, an increase in leakage current becomes obvious and thus, power consumption is increased. In order to reduce power consumption, an attempt has been made to stop the supply of power supply voltage to a semiconductor device in a period when data is not input or output, for example.

However, a flip-flop used as a register and an SRAM used as a cache memory are volatile memory devices. Therefore, in the case where the supply of power supply voltage to a semiconductor device is stopped, data which has been lost in a volatile memory device such as a register or a cache memory need to be restored after the supply of power supply voltage is restarted.

In view of this, a semiconductor device in which a nonvolatile memory device is located on the periphery of a volatile memory device has been developed. For example, Patent Document 1 discloses a technique in which data held by a flip-flop or the like is stored in a ferroelectric memory before the supply of power supply voltage is stopped, and the data stored in the ferroelectric memory is restored to the flip-flop or the like after the supply of power supply voltage is restarted.

One effective method for reducing power consumption of a semiconductor device such as a PLD or a CPU is to decrease power supply voltage. Power consumption is proportional to power supply voltage; therefore, as power supply voltage decreases, power consumption can be reduced.

However, a low power supply voltage results in a low ratio of on-state current to off-state current of a transistor. This causes a logic circuit to have an unstable output voltage and the transistor to have an increased leakage current.

In view of this, a circuit for ensuring a sufficient ratio of on-state current to off-state current of a transistor has been proposed. For example, Non-Patent Document 1 discloses a flip-flop for which a Schmitt trigger circuit is used and which can be driven at low voltage. With the use of a Schmitt trigger circuit for a flip-flop, a stable output voltage can be obtained even at a low power supply voltage, and power consumption can be reduced with a low flow-through current.

Patent Document

[Patent Document 1] Japanese Published Patent Application No. H10-078836

Non-Patent Document

[Non-Patent Document 1] N. Lotze et al., "A 62 mV 0.13 μm CMOS Standard-Cell-Based Design Technique Using Schmitt-Trigger Logic," IEEE JOURNAL OF SOLID-STATE CIRCUITS, Vol. 47, No. 1, pp. 47-60, January 2012

DISCLOSURE OF INVENTION

An object of one embodiment of the present invention is to provide a nonvolatile semiconductor device which can be driven at low voltage. Another object of one embodiment of the present invention is to provide a nonvolatile semiconductor device which can be driven at low voltage and is resistant to process variations. Another object of one embodiment of the present invention is to provide a nonvolatile semiconductor device with low power consumption.

One embodiment of the present invention is a semiconductor device including a Schmitt trigger NAND and a Schmitt trigger inverter. In the semiconductor device, data is held in a period when the supply of power supply voltage is continued, and a potential corresponding to the data is stored at a node electrically connected to a capacitor before a period when the supply of power supply voltage is stopped. By utilizing a change in channel resistance of a transistor whose gate is connected to the node, the data is restored in response to the restart of the supply of power supply voltage.

One embodiment of the present invention is a semiconductor device including a first memory circuit portion and a second memory circuit portion. The first memory circuit portion includes a Schmitt trigger NAND circuit, a first node capable of holding one of a first potential and a second potential, and a second node capable of holding the other of the first potential and the second potential. The second memory circuit portion includes first and second Schmitt trigger inverters, first to sixth transistors, and first and second capacitors. An input terminal of the first Schmitt trigger inverter is electrically connected to the first node. An output terminal of the first Schmitt trigger inverter is electrically connected to one of a source and a drain of the first transistor. A gate of the first transistor is electrically connected to a wiring to which a first control signal is supplied. The other of the source and the drain of the first transistor is electrically connected to a third node. A first electrode of the first capacitor is electrically connected to the third node. A second electrode of the first capacitor is electrically connected to a wiring to which the first potential is supplied. One of a source and a drain of the second transistor is electrically connected to the first node. A gate of the second transistor is electrically connected to a wiring to which a second control signal is supplied. The other of the source and the drain of the second transistor is electrically connected to one of a source and a drain of the third transistor. A gate of the third transistor is electrically connected to the third node. The other of the source and the drain of the third transistor is electrically connected to the wiring to which the first potential is supplied. An input terminal of the second Schmitt trigger inverter is electrically connected to the second node. An output terminal of the second Schmitt trigger inverter is electrically connected to one of a source and a drain of the fourth transistor. A gate of the fourth transistor is electrically connected to the wiring to which the first control signal is supplied. The other of the source and the drain of the fourth transistor is electrically connected to a fourth node. A first electrode of the second capacitor is electrically connected to the fourth node. A second electrode of the second capacitor is electrically connected to the wiring to which the first potential is supplied. One of a source and a drain of the fifth transistor is electrically connected to the second node. A gate of the fifth transistor is electrically connected to the wiring to which the second control signal is supplied. The other of the source and the drain of the fifth transistor is electrically connected to one of a source and a drain of the sixth transistor. A gate of the sixth transistor is electrically connected to the fourth node. The other of the source and the drain of the sixth transistor is electrically connected to the wiring to which the first potential is supplied. The first transistor and the fourth transistor each include a semiconductor film containing an oxide semiconductor.

In one embodiment of the present invention, it is preferable that the first memory circuit portion hold the one of the first potential and the second potential at the first node and the other of the first potential and the second potential at the second node in a period when the supply of power supply voltage is continued, and that the second memory circuit portion hold the other of the first potential and the second potential at the third node and the one of the first potential and the second potential at the fourth node in a period when the supply of power supply voltage is stopped.

According to one embodiment of the present invention, a nonvolatile semiconductor device which can be driven at low voltage can be provided. According to one embodiment of the present invention, a nonvolatile semiconductor device which can be driven at low voltage and is resistant to process variations can be provided. According to one embodiment of the present invention, a nonvolatile semiconductor device with low power consumption can be provided.

BRIEF DESCRIPTION OF DRAWINGS

FIG. 13 is a block diagram of a semiconductor device.

BEST MODE FOR CARRYING OUT THE INVENTION

Figure 1:
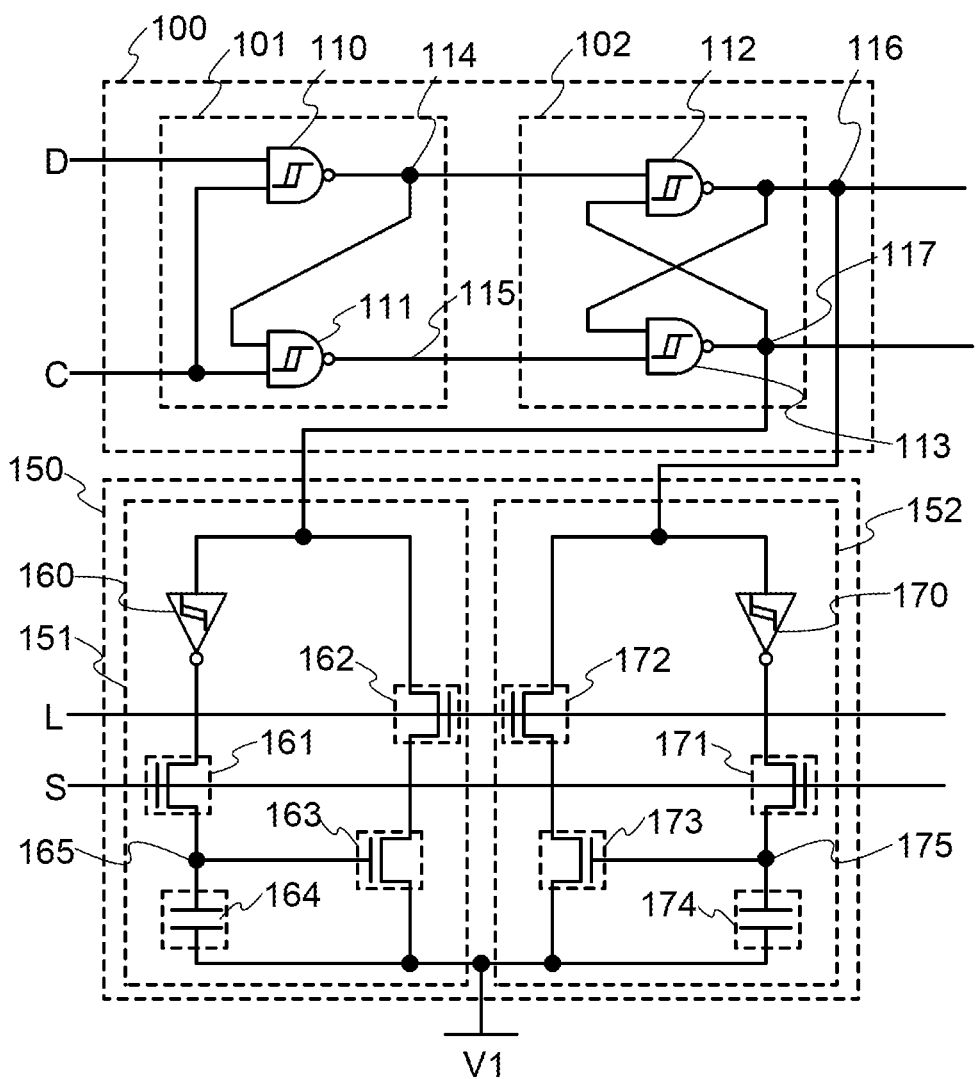
FIG. 1 is a circuit diagram of a semiconductor device.

Examples of embodiments of the present invention will be described with reference to the accompanying drawings. Note that the present invention is not limited to the following description, and it will be easily understood by those skilled in the art that various changes and modifications of embodiments and details of the present invention can be made without departing from the spirit and scope of the present invention. Therefore, the present invention should not be construed as being limited to the description in the following embodiments. Note that, in description with reference to the drawings, the same components in different diagrams may be commonly denoted by the same reference numeral. Furthermore, the same hatch pattern is applied to similar parts, and the similar parts are not especially denoted by reference numerals in some cases.

Embodiment 1

In this embodiment, an example of a semiconductor device including a nonvolatile portion and a volatile portion is described.

FIG. 1 is a circuit diagram of a latch circuit. The latch circuit illustrated in FIG. 1 includes a first memory circuit portion 100 and a second memory circuit portion 150. The first memory circuit portion 100 has a function of holding a potential corresponding to data in a period when power supply voltage is continuously supplied. The second memory circuit portion 150 has a function of holding a potential corresponding to data in a period when the supply of power supply voltage is stopped.

The first memory circuit portion 100 includes a gate portion 101 and a latch portion 102.

The gate portion 101 includes a Schmitt trigger NAND circuit (hereinafter also referred to as ST-NAND) 110 and an ST-NAND 111.

A first input terminal of the ST-NAND 110 is electrically connected to a wiring to which a data signal D is supplied. A second input terminal of the ST-NAND 110 is electrically connected to a wiring to which a clock signal C is supplied. An output terminal of the ST-NAND 110 is electrically connected to a first input terminal of the ST-NAND 111 and a first input terminal of an ST-NAND 112 of the latch portion 102.

A second input terminal of the ST-NAND 111 is electrically connected to the wiring to which the clock signal C is supplied. An output terminal of the ST-NAND 111 is electrically connected to a second input terminal of an ST-NAND 113 of the latch portion 102.

The latch portion 102 includes the ST-NAND 112 and the ST-NAND 113.

The first input terminal of the ST-NAND 112 is electrically connected to the output terminal of the ST-NAND 110. A second input terminal of the ST-NAND 112 is electrically connected to an output terminal of the ST-NAND 113. An output terminal of the ST-NAND 112 is electrically connected to a first input terminal of the ST-NAND 113.

The second input terminal of the ST-NAND 113 is electrically connected to the output terminal of the ST-NAND 111.

The second memory circuit portion 150 includes a first block 151 and a second block 152.

The first block 151 includes a Schmitt trigger inverter (hereinafter also referred to as ST-NV) 160, an n-channel transistor 161, an n-channel transistor 162, an n-channel transistor 163, and a capacitor 164.

An input terminal of the ST-NV 160 is electrically connected to the output terminal of the ST-NAND 113 of the latch portion 102. An output terminal of the ST-INV 160 is electrically connected to one of a source and a drain of the transistor 161.

A gate of the transistor 161 is electrically connected to a wiring to which a control signal Save (hereinafter also referred to as control signal S) is supplied. The other of the source and the drain of the transistor 161 is electrically connected to a gate of the transistor 163 and a first electrode of the capacitor 164.

One of a source and a drain of the transistor 162 is electrically connected to the output terminal of the ST-NAND 113 of the latch portion 102. The other of the source and the drain of the transistor 162 is electrically connected to one of a source and a drain of the transistor 163. A gate of the transistor 162 is electrically connected to a wiring to which a control signal Load (hereinafter also referred to as control signal L) is supplied.

A second electrode of the capacitor 164 and the other of the source and the drain of the transistor 163 are electrically connected to a wiring to which a potential V1 is supplied.

The second block 152 includes an ST-NV 170, an n-channel transistor 171, an n-channel transistor 172, an n-channel transistor 173, and a capacitor 174.

An input terminal of the ST-NV 170 is electrically connected to the output terminal of the ST-NAND 112 of the latch portion 102. An output terminal of the ST-INV 170 is electrically connected to one of a source and a drain of the transistor 171.

A gate of the transistor 171 is electrically connected to the wiring to which the control signal S is supplied. The other of the source and the drain of the transistor 171 is electrically connected to a gate of the transistor 173 and a first electrode of the capacitor 174.

One of a source and a drain of the transistor 172 is electrically connected to the output terminal of the ST-NAND 112 of the latch portion 102. The other of the source and the drain of the transistor 172 is electrically connected to one of a source and a drain of the transistor 173. A gate of the transistor 172 is electrically connected to the wiring to which the control signal L is supplied.

A second electrode of the capacitor 174 and the other of the source and the drain of the transistor 173 are electrically connected to the wiring to which the potential V1 is supplied.

Note that a point where the output terminal of the ST-NAND 112 and the input terminal of the ST-NV 170 are electrically connected is referred to as a node 116, and a point where the output terminal of the ST-NAND 113 and the input terminal of the ST-INV 160 are electrically connected is referred to as a node 117.

Note that the number of inputs of each logic gate (ST-NAND or ST-NV) used in the first memory circuit portion 100 and the second memory circuit portion 150 is preferably 2 or less. This configuration can reduce the effect of variation in threshold voltage of transistors.

Note that it is preferable that the transistors 161 and 171 be transistors with small leakage current in a non-conductive state (small off-state current). Here, the term "small leakage current" means that a normalized off-state current per micrometer in channel width at room temperature is less than or equal to 10 zA. Since the off-state current is preferably as small as possible, the normalized off-state current is preferably less than or equal to 1 zA, more preferably less than or equal to 10 yA, still more preferably less than or equal to 1 yA. Note that voltage between a source and a drain in that case is, for example, approximately 0.1 V, 5 V, or 10 V. An example of a transistor with such a small off-state current is a transistor including an oxide semiconductor in a channel.

An ST-NAND and an ST-NV are described here.

Figure 2A:
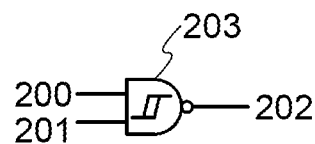
FIGS. 2A and 2B are circuit diagrams of a semiconductor device.
Figure 2B:
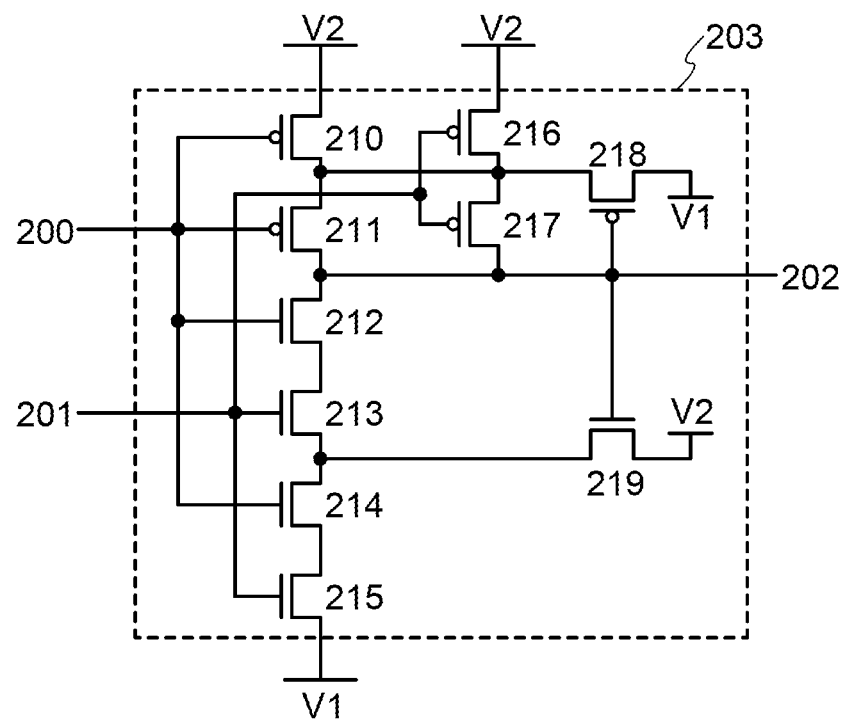

FIG. 2A illustrates an ST-NAND 203 having a first input terminal, a second input terminal, and an output terminal which are electrically connected to a wiring 200, a wiring 201, and a wiring 202, respectively. FIG. 2B illustrates an example of a specific configuration of the ST-NAND 203 illustrated in FIG. 2A.

The ST-NAND 203 illustrated in FIG. 2B includes p-channel transistors 210, 211, 216, 217, and 218 and n-channel transistors 212, 213, 214, 215, and 219.

One of a source and a drain of the transistor 210 is electrically connected to a wiring to which a potential V2 is supplied. A gate of the transistor 210 is electrically connected to the wiring 200. The other of the source and the drain of the transistor 210 is electrically connected to one of a source and a drain of the transistor 211.

A gate of the transistor 211 is electrically connected to the wiring 200. The other of the source and the drain of the transistor 211 is electrically connected to one of a source and a drain of the transistor 212 and the wiring 202.

A gate of the transistor 212 is electrically connected to the wiring 200. The other of the source and the drain of the transistor 212 is electrically connected to one of a source and a drain of the transistor 213.

A gate of the transistor 213 is electrically connected to the wiring 201. The other of the source and the drain of the transistor 213 is electrically connected to one of a source and a drain of the transistor 214 and one of a source and a drain of the transistor 219.

A gate of the transistor 214 is electrically connected to the wiring 200. The other of the source and the drain of the transistor 214 is electrically connected to one of a source and a drain of the transistor 215.

A gate of the transistor 215 is electrically connected to the wiring 201. The other of the source and the drain of the transistor 215 is electrically connected to a wiring to which a potential V1 is supplied.

One of a source and a drain of the transistor 216 is electrically connected to the wiring to which the potential V2 is supplied. The other of the source and the drain of the transistor 216 is electrically connected to the other of the source and the drain of the transistor 210, the one of the source and the drain of the transistor 211, one of a source and a drain of the transistor 217, and one of a source and a drain of the transistor 218. A gate of the transistor 216 is electrically connected to the wiring 201.

A gate of the transistor 217 is electrically connected to the wiring 201. The other of the source and the drain of the transistor 217 is electrically connected to the other of the source and the drain of the transistor 211, the one of the source and the drain of the transistor 212, and the wiring 202.

A gate of the transistor 218 is electrically connected to the other of the source and the drain of the transistor 211, the one of the source and the drain of the transistor 212, the other of the source and the drain of the transistor 217, a gate of the transistor 219, and the wiring 202. The other of the source and the drain of the transistor 218 is electrically connected to the wiring to which the potential V1 is supplied.

The other of the source and the drain of the transistor 219 is electrically connected to the wiring to which the potential V2 is supplied.

The transistor 218 has a function of controlling an electrical connection between a node where the other of the source and the drain of the transistor 210, the one of the source and the drain of the transistor 211, the other of the source and the drain of the transistor 216, and the one of the source and the drain of the transistor 217 are electrically connected and the wiring to which the potential V1 is supplied, in accordance with the potential of the wiring 202.

The transistor 219 has a function of controlling an electrical connection between a node where the other of the source and the drain of the transistor 213 and the one of the source and the drain of the transistor 214 are electrically connected and the wiring to which the potential V2 is supplied, in accordance with the potential of the wiring 202.

Note that in this specification, the potential V1 is a low power supply potential VSS, and the potential V2 is a high power supply potential VDD. Note that the potential V1 may be a ground potential GND.

A potential held in accordance with the potential V1 may be referred to as a potential at an "L level," and a potential held in accordance with the potential V2 may be referred to as a potential at an "H level."

The ST-NAND 203 illustrated in FIG. 2B can prevent the potential of the wiring 202 from decreasing when the potential of the wiring 202 should be at the H level or prevent the potential of the wiring 202 from increasing when the potential of the wiring 202 should be at the L level, even in the case where power supply voltage is low.

Figure 3A:
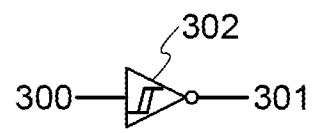
FIGS. 3A and 3B are circuit diagrams of a semiconductor device.
Figure 3B:
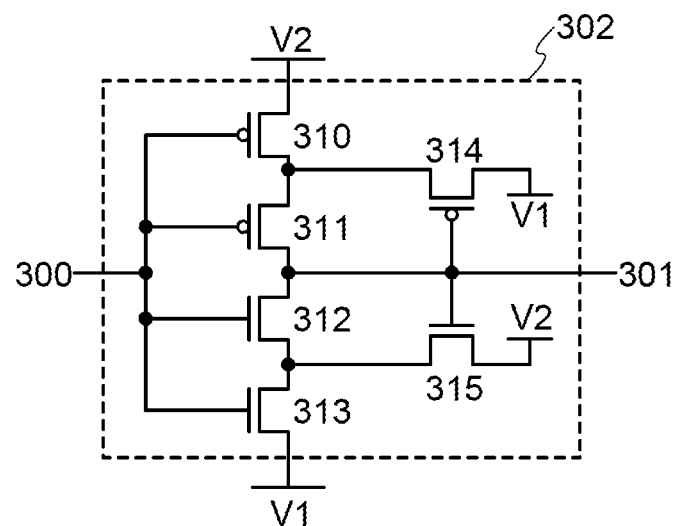

FIG. 3A illustrates an ST-NV 302 having an input terminal and an output terminal which are electrically connected to a wiring 300 and a wiring 301, respectively. FIG. 3B illustrates an example of a specific configuration of the ST-NV 302 illustrated in FIG. 3A.

The ST-NV 302 illustrated in FIG. 3B includes p-channel transistors 310, 311, and 314 and n-channel transistors 312, 313, and 315.

One of a source and a drain of the transistor 310 is electrically connected to a wiring to which the potential V2 is supplied. The other of the source and the drain of the transistor 310 is electrically connected to one of a source and a drain of the transistor 311 and one of a source and a drain of the transistor 314. A gate of the transistor 310 is electrically connected to the wiring 300.

A gate of the transistor 311 is electrically connected to the wiring 300. The other of the source and the drain of the transistor 311 is electrically connected to one of a source and a drain of the transistor 312 and the wiring 301.

A gate of the transistor 312 is electrically connected to the wiring 300. The other of the source and the drain of the transistor 312 is electrically connected to one of a source and a drain of the transistor 313 and one of a source and a drain of the transistor 315.

A gate of the transistor 313 is electrically connected to the wiring 300. The other of the source and the drain of the transistor 313 is electrically connected to a wiring to which the potential V1 is supplied.

The other of the source and the drain of the transistor 314 is electrically connected to the wiring to which the potential V1 is supplied. A gate of the transistor 314 is electrically connected to a gate of the transistor 315 and the wiring 301.

The other of the source and the drain of the transistor 315 is electrically connected to the wiring to which the potential V2 is supplied.

The transistor 314 has a function of controlling an electrical connection between a node where the other of the source and the drain of the transistor 310 and the one of the source and the drain of the transistor 311 are electrically connected and the wiring to which the potential V1 is supplied, in accordance with the potential of the wiring 301.

The transistor 315 has a function of controlling an electrical connection between a node where the other of the source and the drain of the transistor 312 and the one of the source and the drain of the transistor 313 are electrically connected and the wiring to which the potential V2 is supplied, in accordance with the potential of the wiring 301.

The ST-INV 302 illustrated in FIG. 3B can prevent the potential of the wiring 301 from decreasing when the potential of the wiring 301 should be at the H level or prevent the potential of the wiring 301 from increasing when the potential of the wiring 301 should be at the L level, even in the case where power supply voltage is low.

Next, the operation of the latch circuit illustrated in FIG. 1 is described with reference to a timing chart in FIG. 4.

Figure 4:
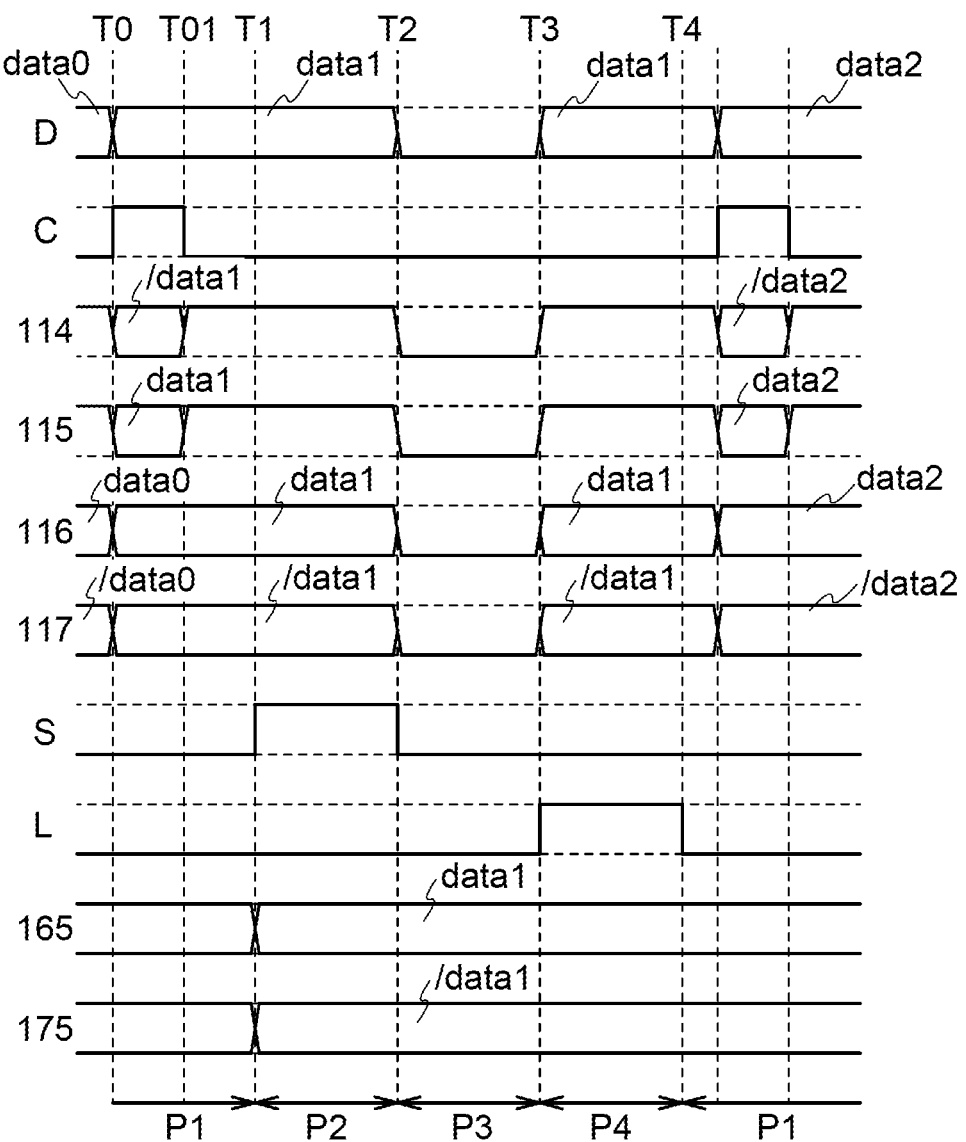
FIG. 4 is a timing chart for a semiconductor device.

In FIG. 4, D denotes the potential of the wiring to which the data signal is supplied; C denotes the potential of the wiring to which the clock signal is supplied; S denotes the potential of the wiring to which the control signal Save is supplied; L denotes the potential of the wiring to which the control signal Load is supplied; reference numeral 114 denotes the output potential of the ST-NAND 110; reference numeral 115 denotes the output potential of the ST-NAND 111; reference numeral 116 denotes the potential of the node 116; reference numeral 117 denotes the potential of the node 117; reference numeral 165 denotes the potential of a node 165 where the other of the source and the drain of the transistor 161, the gate of the transistor 163, and the first electrode of the capacitor 164 are electrically connected; and reference numeral 175 denotes the potential of a node 175 where the other of the source and the drain of the transistor 171, the gate of the transistor 173, and the first electrode of the capacitor 174 are electrically connected.

The data signal has a potential at the H level or at the L level, which is denoted by "data0" here. An inverted data value of "data0" is represented with a slash as "/data0."

The timing chart in FIG. 4 shows states of the latch circuit in periods P1 to P4. The period P1 is a normal operation period. The period P2 is a data transfer period. The period P3 is an operation stop period. The period P4 is a transition period for operation restart.

In the timing chart in FIG. 4, times T0 to T4 are added in order to describe the timings of operations in the periods P1 to P4.

At the time T0, the data signal changes from data0 to data1. In addition, the clock signal becomes the H level. At this time, the output potential 114 of the ST-NAND 110 becomes /data1; the output potential 115 of the ST-NAND 111 becomes data1; the potential of the node 116 becomes data1; the potential of the node 117 becomes /data1; and the data are input to the latch portion 102.

At the time T01, the clock signal becomes the L level. At this time, the output potential 114 of the ST-NAND 110 and the output potential 115 of the ST-NAND 111 become the H level; the potential of the node 116 remains data1; the potential of the node 117 remains /data1; and the data are held by the latch portion 102.

At the time T1, the clock signal is fixed at the L level, and the control signal Save becomes the H level. At this time, the latch portion 102 remains in a data holding state; thus, the potential of the node 116 remains data1, and the potential of the node 117 remains /data1. The potential of the node 116 is transmitted to the node 175 through the ST-NV 170, so that the potential of the node 175 becomes /data1. In addition, the potential of the node 117 is transmitted to the node 165 through the ST-INV 160, so that the potential of the node 165 becomes data1. In this manner, the data can be transferred from the first memory circuit portion 100 to the second memory circuit portion 150.

At the time T2, the supply of the power supply voltage is stopped and the control signal Save becomes the L level. At this time, the node 165 and the node 175 are brought into a floating state, where the data are held. In this manner, the second memory circuit portion 150 holds the data, and the first memory circuit portion 100 loses the data.

At the time T3, the supply of the power supply voltage is restarted, so that the control signal Load becomes the H level. At this time, the potential of the node 116 and the potential of the node 117 are determined by a difference in channel resistance between the transistor 173 and the transistor 163. For example, in the case where data1 is at the H level, the node 175 is at the L level and the node 165 is at the H level. At this time, the transistor 173 is off, and the wiring for supplying the potential V1 at the L level and the node 116 are not electrically connected to each other. On the other hand, the transistor 163 is on, and the wiring for supplying the potential V1 at the L level and the node 117 are electrically connected to each other. Thus, the potential of the node 117 is at the L level. The data values of the node 116 and the node 117 are always inverses of each other; therefore, one of the nodes 116 and 117 is always electrically connected to the wiring for supplying the potential V1 at the L level.

When the supply of the power supply voltage is restarted, the potential D of the wiring to which the data signal is supplied returns to data1, and the potential at the L level is supplied to the wiring to which the clock signal is supplied. At this time, the output potential 114 of the ST-NAND 110 and the output potential 115 of the ST-NAND 111 become the H level. In addition, owing to the second memory circuit portion 150, one of the nodes 116 and 117 is at the L level and the other is at the H level. Accordingly, the potential of the node 116 becomes data1 and the potential of the node 117 becomes /data1, so that the data can be restored in the first memory circuit portion 100.

At the time T4, the control signal Load becomes the L level, and the voltage supply from the second memory circuit portion 150 to the first memory circuit portion 100 is stopped. After this, a normal operation period starts, in which data arithmetic operation is performed.

With the above-described configuration, a semiconductor device which can easily achieve a stop and a restart of supply of power supply voltage while holding data can be provided. Data storage and restoration are performed with the first memory circuit portion 100 and the second memory circuit portion 150, whereby the supply of power supply voltage can be stopped as appropriate and power consumption can be reduced.

At the time of low voltage driving or at the time when there is large variation in threshold voltage or mobility of transistors due to the manufacturing process, there is a case where the transistor 173 cannot have a sufficient ratio of on-state current to off-state current with respect to a voltage value held at the node 175. Similarly, there is a case where the transistor 163 cannot have a sufficient ratio of on-state current to off-state current with respect to a voltage value held at the node 165.

However, even in such cases, at the time of restart of supply of power supply voltage, a potential difference can be generated between the node 116 and the node 117 owing to the difference in channel resistance between the transistor 173 and the transistor 163; thus, data can be restored.

The circuit illustrated in FIG. 1 preferably includes ST-NANDs and ST-INVs in the case where the circuit is driven at low voltage. With the use of ST-NANDs and ST-INVs for the circuit, a stable output voltage can be obtained even at a low power supply voltage, and power consumption can be reduced with a low flow-through current. In addition, with the use of ST-NANDs and ST-INVs, the circuit can be resistant to variation in threshold voltage or mobility of transistors.

With the above-described configuration, a semiconductor device which can easily achieve a stop and a restart of supply of power supply voltage, which can be driven at low voltage, and which is resistant to process variations can be provided.

Embodiment 2

In this embodiment, an example of a semiconductor device including a nonvolatile portion and a volatile portion is described.

Figure 5:
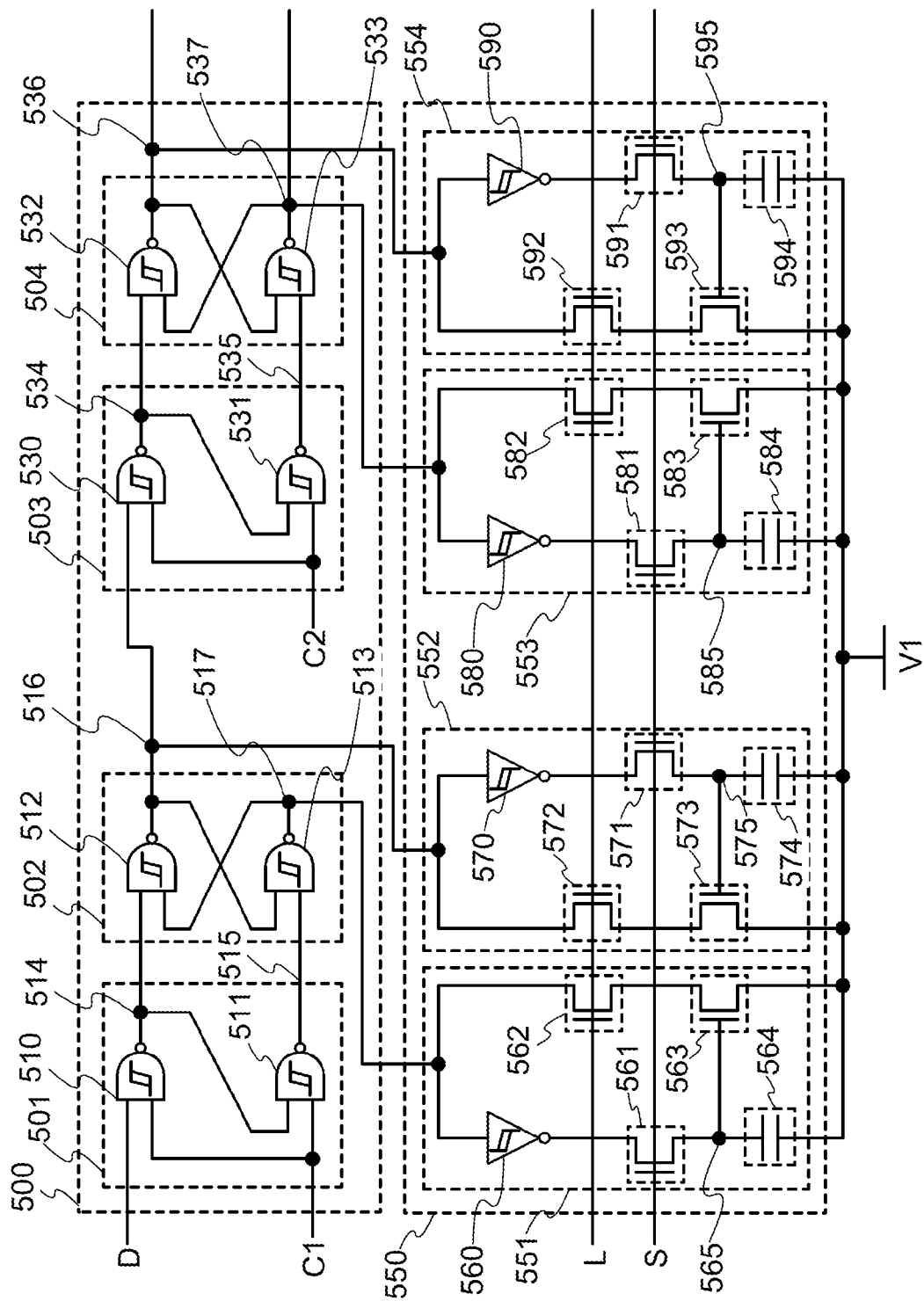
FIG. 5 is a circuit diagram of a semiconductor device.

FIG. 5 is a circuit diagram of a flip-flop circuit. The flip-flop circuit illustrated in FIG. 5 includes a first memory circuit portion 500 and a second memory circuit portion 550. The first memory circuit portion 500 has a function of holding a potential corresponding to data in a period when power supply voltage is continuously supplied. The second memory circuit portion 550 has a function of holding a potential corresponding to data in a period when the supply of power supply voltage is stopped.

The first memory circuit portion 500 includes a gate portion 501, a master latch 502, a gate portion 503, and a slave latch 504.

The gate portion 501 includes an ST-NAND 510 and an ST-NAND 511.

A first input terminal of the ST-NAND 510 is electrically connected to a wiring to which a data signal D is supplied. A second input terminal of the ST-NAND 510 is electrically connected to a wiring to which a first clock signal C1 is supplied. An output terminal of the ST-NAND 510 is electrically connected to a first input terminal of the ST-NAND 511 and a first input terminal of an ST-NAND 512 of the master latch 502.

A second input terminal of the ST-NAND 511 is electrically connected to the wiring to which the first clock signal C1 is supplied. An output terminal of the ST-NAND 511 is electrically connected to a second input terminal of an ST-NAND 513 of the master latch 502.

The master latch 502 includes the ST-NAND 512 and the ST-NAND 513.

The first input terminal of the ST-NAND 512 is electrically connected to the output terminal of the ST-NAND 510. A second input terminal of the ST-NAND 512 is electrically connected to an output terminal of the ST-NAND 513. An output terminal of the ST-NAND 512 is electrically connected to a first input terminal of the ST-NAND 513.

The second input terminal of the ST-NAND 513 is electrically connected to the output terminal of the ST-NAND 511.

The gate portion 503 includes an ST-NAND 530 and an ST-NAND 531.

A first input terminal of the ST-NAND 530 is electrically connected to the output terminal of the ST-NAND 512 of the master latch 502. A second input terminal of the ST-NAND 530 is electrically connected to a wiring to which a second clock signal C2 is supplied. An output terminal of the ST-NAND 530 is electrically connected to a first input terminal of the ST-NAND 531 and a first input terminal of an ST-NAND 532 of the slave latch 504.

A second input terminal of the ST-NAND 531 is electrically connected to the wiring to which the second clock signal C2 is supplied. An output terminal of the ST-NAND 531 is electrically connected to a second input terminal of an ST-NAND 533 of the slave latch 504.

The slave latch 504 includes the ST-NAND 532 and the ST-NAND 533.

The first input terminal of the ST-NAND 532 is electrically connected to the output terminal of the ST-NAND 530. A second input terminal of the ST-NAND 532 is electrically connected to an output terminal of the ST-NAND 533. An output terminal of the ST-NAND 532 is electrically connected to a first input terminal of the ST-NAND 533.

The second input terminal of the ST-NAND 533 is electrically connected to the output terminal of the ST-NAND 531.

The second memory circuit portion 550 includes a first block 551, a second block 552, a third block 553, and a fourth block 554.

The first block 551 includes an ST-NV 560, an n-channel transistor 561, an n-channel transistor 562, an n-channel transistor 563, and a capacitor 564.

An input terminal of the ST-NV 560 is electrically connected to the output terminal of the ST-NAND 513 of the master latch 502. An output terminal of the ST-INV 560 is electrically connected to one of a source and a drain of the transistor 561.

A gate of the transistor 561 is electrically connected to a wiring to which a control signal S is supplied. The other of the source and the drain of the transistor 561 is electrically connected to a gate of the transistor 563 and a first electrode of the capacitor 564.

One of a source and a drain of the transistor 562 is electrically connected to the output terminal of the ST-NAND 513 of the master latch 502. The other of the source and the drain of the transistor 562 is electrically connected to one of a source and a drain of the transistor 563. A gate of the transistor 562 is electrically connected to a wiring to which a control signal L is supplied.

A second electrode of the capacitor 564 and the other of the source and the drain of the transistor 563 are electrically connected to a wiring to which a potential V1 is supplied.

The second block 552 includes an ST-NV 570, an n-channel transistor 571, an n-channel transistor 572, an n-channel transistor 573, and a capacitor 574.

An input terminal of the ST-NV 570 is electrically connected to the output terminal of the ST-NAND 512 of the master latch 502. An output terminal of the ST-INV 570 is electrically connected to one of a source and a drain of the transistor 571.

A gate of the transistor 571 is electrically connected to the wiring to which the control signal S is supplied. The other of the source and the drain of the transistor 571 is electrically connected to a gate of the transistor 573 and a first electrode of the capacitor 574.

One of a source and a drain of the transistor 572 is electrically connected to the output terminal of the ST-NAND 512 of the master latch 502. The other of the source and the drain of the transistor 572 is electrically connected to one of a source and a drain of the transistor 573. A gate of the transistor 572 is electrically connected to the wiring to which the control signal L is supplied.

A second electrode of the capacitor 574 and the other of the source and the drain of the transistor 573 are electrically connected to the wiring to which the potential V1 is supplied.

The third block 553 includes an ST-NV 580, an n-channel transistor 581, an n-channel transistor 582, an n-channel transistor 583, and a capacitor 584.

An input terminal of the ST-NV 580 is electrically connected to the output terminal of the ST-NAND 533 of the slave latch 504. An output terminal of the ST-INV 580 is electrically connected to one of a source and a drain of the transistor 581.

A gate of the transistor 581 is electrically connected to the wiring to which the control signal S is supplied. The other of the source and the drain of the transistor 581 is electrically connected to a gate of the transistor 583 and a first electrode of the capacitor 584.

One of a source and a drain of the transistor 582 is electrically connected to the output terminal of the ST-NAND 533 of the slave latch 504. The other of the source and the drain of the transistor 582 is electrically connected to one of a source and a drain of the transistor 583. A gate of the transistor 582 is electrically connected to the wiring to which the control signal L is supplied.

A second electrode of the capacitor 584 and the other of the source and the drain of the transistor 583 are electrically connected to the wiring to which the potential V1 is supplied.

The fourth block 554 includes an ST-INV 590, an n-channel transistor 591, an n-channel transistor 592, an n-channel transistor 593, and a capacitor 594.

An input terminal of the ST-NV 590 is electrically connected to the output terminal of the ST-NAND 532 of the slave latch 504. An output terminal of the ST-INV 590 is electrically connected to one of a source and a drain of the transistor 591.

A gate of the transistor 591 is electrically connected to the wiring to which the control signal S is supplied. The other of the source and the drain of the transistor 591 is electrically connected to a gate of the transistor 593 and a first electrode of the capacitor 594.

One of a source and a drain of the transistor 592 is electrically connected to the output terminal of the ST-NAND 532 of the slave latch 504. The other of the source and the drain of the transistor 592 is electrically connected to one of a source and a drain of the transistor 593. A gate of the transistor 592 is electrically connected to the wiring to which the control signal L is supplied.

A second electrode of the capacitor 594 and the other of the source and the drain of the transistor 593 are electrically connected to the wiring to which the potential V1 is supplied.

Note that a point where the output terminal of the ST-NAND 512 and the input terminal of the ST-NV 570 are electrically connected is referred to as a node 516, and a point where the output terminal of the ST-NAND 513 and the input terminal of the ST-INV 560 are electrically connected is referred to as a node 517. Furthermore, a point where the output terminal of the ST-NAND 532 and the input terminal of the ST-INV 590 are electrically connected is referred to as a node 536, and a point where the output terminal of the ST-NAND 533 and the input terminal of the ST-NV 580 are electrically connected is referred to as a node 537.

Note that the number of inputs of each logic gate (ST-NAND or ST-NV) used in the first memory circuit portion 500 and the second memory circuit portion 550 is preferably 2 or less. This configuration can reduce the effect of variation in threshold voltage of transistors.

Note that it is preferable that the transistors 561, 571, 581, and 591 be transistors with small leakage current in a nonconductive state (small off-state current).

The circuit illustrated in FIG. 5 preferably includes ST-NANDs and ST-INVs in the case where the circuit is driven at low voltage. With the use of ST-NANDs and ST-INVs for the circuit, a stable output voltage can be obtained even at a low power supply voltage, and power consumption can be reduced with a low flow-through current. In addition, with the use of ST-NANDs and ST-INVs, the circuit can be resistant to variation in threshold voltage or mobility of transistors.

Next, the operation of the flip-flop circuit illustrated in FIG. 5 is described with reference to a timing chart in FIG. 6.

Figure 6:
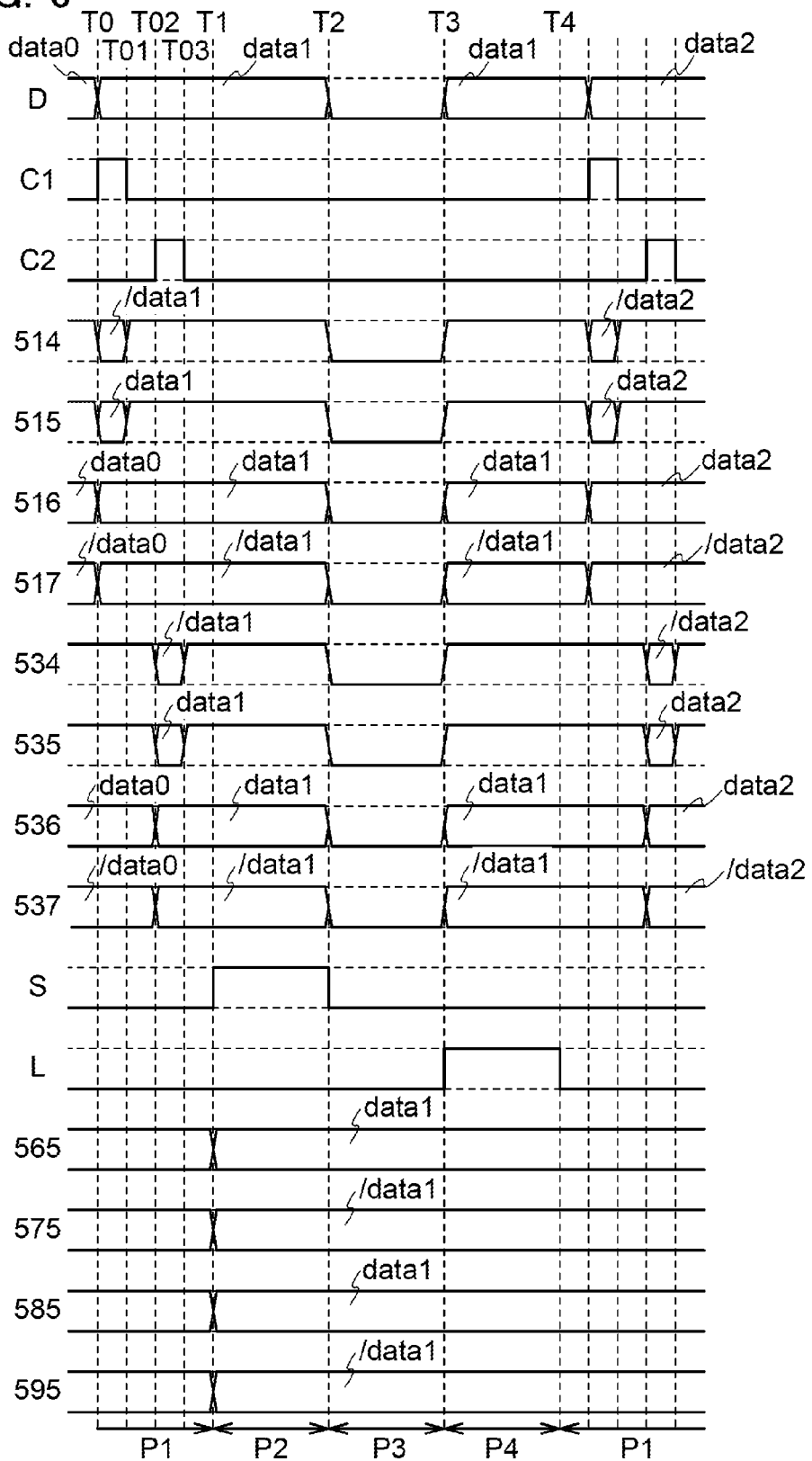
FIG. 6 is a timing chart of a semiconductor device.

In FIG. 6, D denotes the potential of the wiring to which the data signal D is supplied; C1 denotes the potential of the wiring to which the first clock signal C1 is supplied; C2 denotes the potential of the wiring to which the second clock signal C2 is supplied; S denotes the potential of the wiring to which the control signal Save is supplied; L denotes the potential of the wiring to which the control signal Load is supplied; reference numeral 514 denotes the output potential of the ST-NAND 510; reference numeral 515 denotes the output potential of the ST-NAND 511; reference numeral 516 denotes the potential of the node 516; reference numeral 517 denotes the potential of the node 517; reference numeral 534 denotes the output potential of the ST-NAND 530; reference numeral 535 denotes the output potential of the ST-NAND 531; reference numeral 536 denotes the potential of the node 536; reference numeral 537 denotes the potential of the node 537; reference numeral 565 denotes the potential of a node 565 where the other of the source and the drain of the transistor 561, the gate of the transistor 563, and the first electrode of the capacitor 564 are electrically connected; reference numeral 575 denotes the potential of a node 575 where the other of the source and the drain of the transistor 571, the gate of the transistor 573, and the first electrode of the capacitor 574 are electrically connected; reference numeral 585 denotes the potential of a node 585 where the other of the source and the drain of the transistor 581, the gate of the transistor 583, and the first electrode of the capacitor 584 are electrically connected; and reference numeral 595 denotes the potential of a node 595 where the other of the source and the drain of the transistor 591, the gate of the transistor 593, and the first electrode of the capacitor 594 are electrically connected.

The data signal has a potential at the H level or at the L level, which is denoted by "data0" here. An inverted data value of "data0" is represented with a slash as "/data0."

The timing chart in FIG. 6 shows states of the flip-flop circuit in periods P1 to P4. The period P1 is a normal operation period. The period P2 is a data transfer period. The period P3 is an operation stop period. The period P4 is a transition period for operation restart.

In the timing chart in FIG. 6, times T0 to T4 are added in order to describe the timings of operations in the periods P1 to P4.

At the time T0, the data signal changes from data0 to data1. In addition, the first clock signal C1 becomes the H level. At this time, the output potential 514 of the ST-NAND 510 becomes /data1; the output potential 515 of the ST-NAND 511 becomes data1; the potential of the node 516 becomes data1; the potential of the node 517 becomes /data1; and the data are input to the master latch 502.

At the time T01, the first clock signal C1 becomes the L level. At this time, the output potential 514 of the ST-NAND 510 and the output potential 515 of the ST-NAND 511 become the H level; the potential of the node 516 remains data1; the potential of the node 517 remains /data1; and the data are held by the master latch 502.

At the time T02, the second clock signal C2 becomes the H level. At this time, the output potential 534 of the ST-NAND 530 becomes /data1; the output potential 535 of the ST-NAND 531 becomes data1; the potential of the node 536 becomes data1; the potential of the node 537 becomes /data1; and the data are input to the slave latch 504.

At the time T03, the second clock signal C2 becomes the L level. At this time, the output potential 534 of the ST-NAND 530 and the output potential 535 of the ST-NAND 531 become the H level; the potential of the node 536 remains data1; the potential of the node 537 remains /data1; and the data are held by the slave latch 504.

At the time T1, the first clock signal C1 and the second clock signal C2 are fixed at the L level, and the control signal Save becomes the H level. At this time, the master latch 502 and the slave latch 504 remain in a data holding state. Thus, the potential of the node 516 remains data1; the potential of the node 517 remains /data1; the potential of the node 536 remains data1; and the potential of the node 537 remains /data1. The potential of the node 516 is transmitted to the node 575 through the ST-INV 570, so that the potential of the node 575 becomes /data1. In addition, the potential of the node 517 is transmitted to the node 565 through the ST-INV 560, so that the potential of the node 565 becomes data1. In addition, the potential of the node 536 is transmitted to the node 595 through the ST-NV 590, so that the potential of the node 595 becomes /data1. In addition, the potential of the node 537 is transmitted to the node 585 through the ST-NV 580, so that the potential of the node 585 becomes data1. In this manner, the data can be transferred from the first memory circuit portion 500 to the second memory circuit portion 550.

At the time T2, the supply of the power supply voltage is stopped and the control signal Save becomes the L level. At this time, the node 565, the node 575, the node 585, and the node 595 are brought into a floating state, where the data are held. In this manner, the second memory circuit portion 550 holds the data, and the first memory circuit portion 500 loses the data.

At the time T3, the supply of the power supply voltage is restarted, so that the control signal Load becomes the H level. At this time, the potential of the node 516 and the potential of the node 517 are determined by a difference in channel resistance between the transistor 573 and the transistor 563, and the potential of the node 536 and the potential of the node 537 are determined by a difference in channel resistance between the transistor 593 and the transistor 583. For example, in the case where data1 is at the H level, the node 575 is at the L level and the node 565 is at the H level. At this time, the transistor 573 is off, and the wiring for supplying the potential V1 at the L level and the node 516 are not electrically connected to each other. On the other hand, the transistor 563 is on, and the wiring for supplying the potential V1 at the L level and the node 517 are electrically connected to each other. Thus, the potential of the node 517 is at the L level. The data values of the node 516 and the node 517 are always inverses of each other; therefore, one of the nodes 516 and 517 is always electrically connected to the wiring for supplying the potential V1 at the L level. Similarly, in the case where data1 is at the H level, the node 595 is at the L level and the node 585 is at the H level. At this time, the transistor 593 is off, and the wiring for supplying the potential V1 at the L level and the node 536 are not electrically connected to each other. On the other hand, the transistor 583 is on, and the wiring for supplying the potential V1 at the L level and the node 537 are electrically connected to each other. Thus, the potential of the node 537 is at the L level. The data values of the node 536 and the node 537 are always inverses of each other; therefore, one of the nodes 536 and 537 is always electrically connected to the wiring for supplying the potential V1 at the L level.

When the supply of the power supply voltage is restarted, the potential D of the wiring to which the data signal is supplied returns to data1, and the potential at the L level is supplied to the wiring to which the first clock signal C1 is supplied. At this time, the output potential 514 of the ST-NAND 510 and the output potential 515 of the ST-NAND 511 become the H level. In addition, owing to the second memory circuit portion 550, one of the nodes 516 and 517 is at the L level and the other is at the H level. Accordingly, the potential of the node 516 becomes data1 and the potential of the node 517 becomes /data1, so that the data can be restored in the first memory circuit portion 500.

At the same time, the potential at the L level is supplied to the wiring to which the second clock signal C2 is supplied. At this time, the output potential 534 of the ST-NAND 530 and the output potential 535 of the ST-NAND 531 become the H level. In addition, owing to the second memory circuit portion 550, one of the nodes 536 and 537 is at the L level and the other is at the H level. Accordingly, the potential of the node 536 becomes data1 and the potential of the node 537 becomes /data1, so that the data can be restored in the first memory circuit portion 500.

At the time T4, the control signal Load becomes the L level, and the voltage supply from the second memory circuit portion 550 to the first memory circuit portion 500 is stopped. After this, a normal operation period starts, in which data arithmetic operation is performed.

With the above-described configuration, a semiconductor device which can easily achieve a stop and a restart of supply of power supply voltage can be provided. Data storage and restoration are performed with the first memory circuit portion 500 and the second memory circuit portion 550, whereby the supply of power supply voltage can be stopped as appropriate and power consumption can be reduced.

At the time of low voltage driving or at the time when there is large variation in threshold voltage or mobility of transistors due to the manufacturing process, there is a case where the transistor 563 cannot have a sufficient ratio of on-state current to off-state current with respect to a voltage value held at the node 565. Similarly, there is a case where the transistor 573, the transistor 583, and the transistor 593 cannot have sufficient ratios of on-state current to off-state current with respect to voltage values held at the node 575, the node 585, and the node 595, respectively.

However, in such cases, at the time of restart of supply of power supply voltage, a potential difference can be generated between the node 516 and the node 517 owing to the difference in channel resistance between the transistor 573 and the transistor 563; thus, data can be restored. Similarly, a potential difference can be generated between the node 536 and the node 537 owing to the difference in channel resistance between the transistor 593 and the transistor 583; thus, data can be restored.

With the above-described configuration, a semiconductor device which can easily achieve a stop and a restart of supply of power supply voltage, which can be driven at low voltage, and which is resistant to process variations can be provided.

Embodiment 3

In this embodiment, an example of a semiconductor device including a nonvolatile portion and a volatile portion is described.

Figure 7:
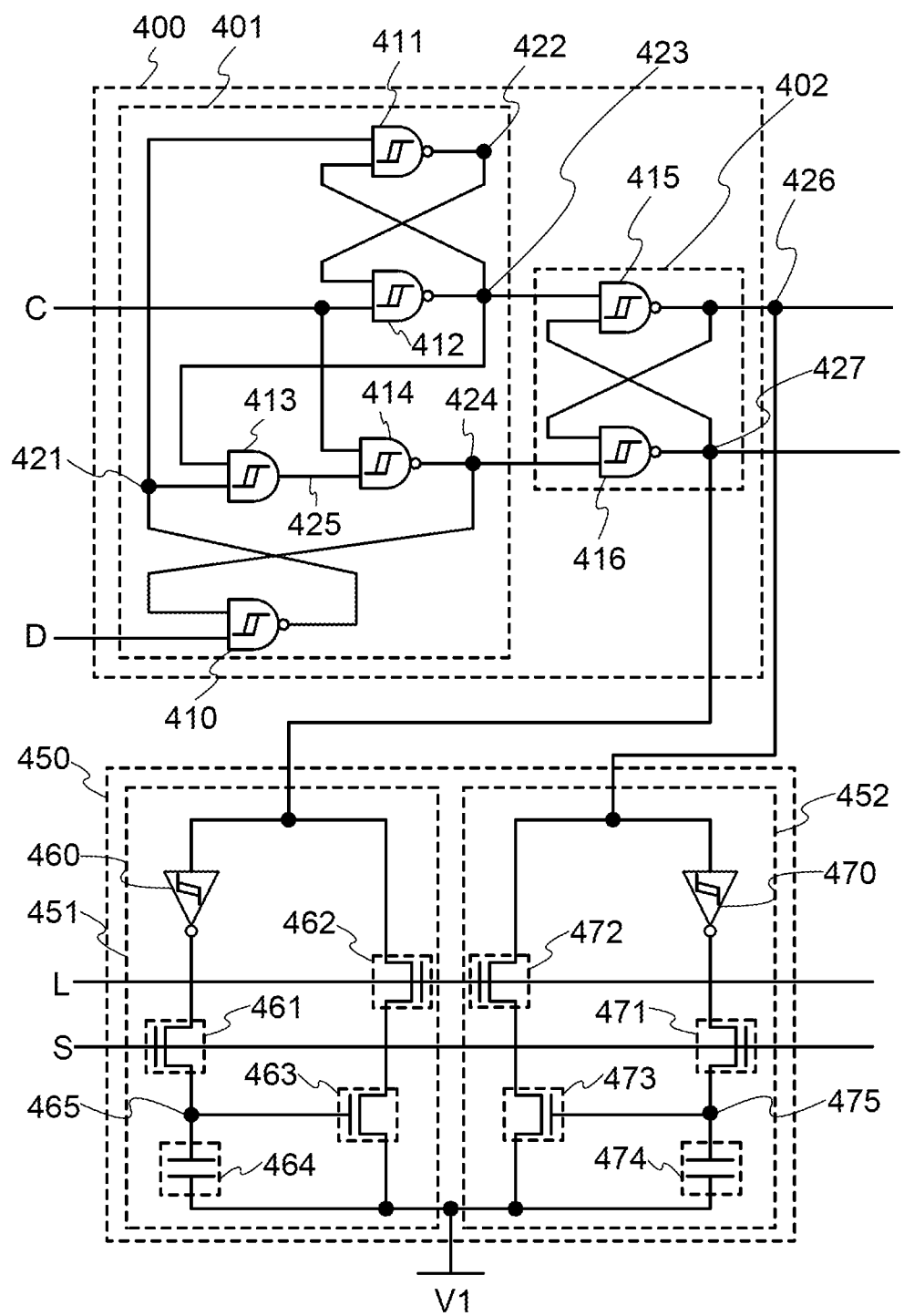
FIG. 7 is a circuit diagram of a semiconductor device.

FIG. 7 is a circuit diagram of a flip-flop circuit. The flip-flop circuit illustrated in FIG. 7 has a configuration different from that of the flip-flop circuit illustrated in FIG. 5. The flip-flop circuit illustrated in FIG. 7 includes a first memory circuit portion 400 and a second memory circuit portion 450. The first memory circuit portion 400 has a function of holding a potential corresponding to data in a period when power supply voltage is continuously supplied. The second memory circuit portion 450 has a function of holding a potential corresponding to data in a period when the supply of power supply voltage is stopped.

The first memory circuit portion 400 includes a gate portion 401 and a latch portion 402.

The gate portion 401 includes an ST-NAND 410, an ST-NAND 411, an ST-NAND 412, a Schmitt trigger AND circuit (hereinafter also referred to as ST-AND) 413, and an ST-NAND 414.

A first input terminal of the ST-NAND 410 is electrically connected to a wiring to which a data signal D is supplied. A second input terminal of the ST-NAND 410 is electrically connected to an output terminal of the ST-NAND 414. An output terminal of the ST-NAND 410 is electrically connected to a first input terminal of the ST-AND 413 and a first input terminal of the ST-NAND 411.

A second input terminal of the ST-NAND 411 is electrically connected to an output terminal of the ST-NAND 412. An output terminal of the ST-NAND 411 is electrically connected to a first input terminal of the ST-NAND 412.

A second input terminal of the ST-NAND 412 is electrically connected to a wiring to which a clock signal C is supplied. The output terminal of the ST-NAND 412 is electrically connected to a second input terminal of the ST-AND 413.

A first input terminal of the ST-NAND 414 is electrically connected to the wiring to which the clock signal C is supplied. A second input terminal of the ST-NAND 414 is electrically connected to an output terminal of the ST-AND 413.

The latch portion 402 includes an ST-NAND 415 and an ST-NAND 416.

A first input terminal of the ST-NAND 415 is electrically connected to the output terminal of the ST-NAND 412 of the gate portion 401. A second input terminal of the ST-NAND 415 is electrically connected to an output terminal of the ST-NAND 416. An output terminal of the ST-NAND 415 is electrically connected to a first input terminal of the ST-NAND 416.

A second input terminal of the ST-NAND 416 is electrically connected to the output terminal of the ST-NAND 414 of the gate portion 401.

The second memory circuit portion 450 includes a first block 451 and a second block 452.

The first block 451 includes an ST-NV 460, an n-channel transistor 461, an n-channel transistor 462, an n-channel transistor 463, and a capacitor 464.

An input terminal of the ST-NV 460 is electrically connected to the output terminal of the ST-NAND 416 of the latch portion 402. An output terminal of the ST-INV 460 is electrically connected to one of a source and a drain of the transistor 461.

A gate of the transistor 461 is electrically connected to a wiring to which a control signal Save (hereinafter also referred to as control signal S) is supplied. The other of the source and the drain of the transistor 461 is electrically connected to a gate of the transistor 463 and a first electrode of the capacitor 464.

One of a source and a drain of the transistor 462 is electrically connected to the output terminal of the ST-NAND 416 of the latch portion 402. The other of the source and the drain of the transistor 462 is electrically connected to one of a source and a drain of the transistor 463. A gate of the transistor 462 is electrically connected to a wiring to which a control signal Load (hereafter also referred to as control signal L) is supplied.

A second electrode of the capacitor 464 and the other of the source and the drain of the transistor 463 are electrically connected to a wiring to which a potential V1 is supplied.

The second block 452 includes an ST-NV 470, an n-channel transistor 471, an n-channel transistor 472, an n-channel transistor 473, and a capacitor 474.

An input terminal of the ST-NV 470 is electrically connected to the output terminal of the ST-NAND 415 of the latch portion 402. An output terminal of the ST-INV 470 is electrically connected to one of a source and a drain of the transistor 471.

A gate of the transistor 471 is electrically connected to the wiring to which the control signal S is supplied. The other of the source and the drain of the transistor 471 is electrically connected to a gate of the transistor 473 and a first electrode of the capacitor 474.

One of a source and a drain of the transistor 472 is electrically connected to the output terminal of the ST-NAND 415 of the latch portion 402. The other of the source and the drain of the transistor 472 is electrically connected to one of a source and a drain of the transistor 473. A gate of the transistor 472 is electrically connected to the wiring to which the control signal L is supplied.

A second electrode of the capacitor 474 and the other of the source and the drain of the transistor 473 are electrically connected to the wiring to which the potential V1 is supplied.

Note that a point where the output terminal of the ST-NAND 410, the first input terminal of the ST-NAND 411, and the first input terminal of the ST-AND 413 are electrically connected is referred to as a node 421. A point where the output terminal of the ST-NAND 412, the second input terminal of the ST-NAND 411, the second input terminal of the ST-AND 413, and the first input terminal of the ST-NAND 415 are electrically connected is referred to as a node 423. A point where the output terminal of the ST-NAND 414, the second input terminal of the ST-NAND 410, and the second input terminal of the ST-NAND 416 are electrically connected is referred to as a node 424. A point where the output terminal of the ST-NAND 415 and the input terminal of the ST-NV 470 are electrically connected is referred to as a node 426. A point where the output terminal of the ST-NAND 416 and the input terminal of the ST-NV 460 are electrically connected is referred to as a node 427.

Note that the number of inputs of each logic gate (ST-NAND, ST-NV, or ST-AND) used in the first memory circuit portion 400 and the second memory circuit portion 450 is preferably 2 or less. This configuration can reduce the effect of variation in threshold voltage of transistors.

Note that it is preferable that the transistors 461 and 471 be transistors with small leakage current in a non-conductive state (small off-state current).

The circuit illustrated in FIG. 7 preferably includes ST-NANDs, ST-INVs, and an ST-AND in the case where the circuit is driven at low voltage. With the use of ST-NANDs and ST-INVs for the circuit, a stable output voltage can be obtained even at a low power supply voltage, and power consumption can be reduced with a low flow-through current. In addition, with the use of ST-NANDs, ST-INVs, and an ST-AND, the circuit can be resistant to variation in threshold voltage or mobility of transistors.

An ST-AND is described here.

Figure 8A:
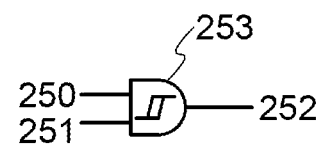
FIGS. 8A and 8B are circuit diagrams of a semiconductor device.
Figure 8B:
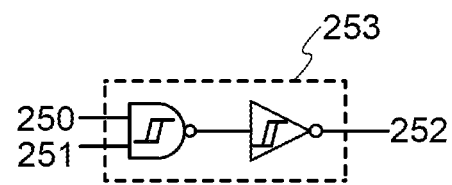

FIG. 8A illustrates an ST-AND 253 having a first input terminal, a second input terminal, and an output terminal which are electrically connected to a wiring 250, a wiring 251, and a wiring 252, respectively. As illustrated in FIG. 8B, the ST-AND 253 includes an ST-NAND and an ST-NV, and an output terminal of the ST-NAND is electrically connected to an input terminal of the ST-NV. As the ST-NAND, the configuration illustrated in FIG. 2B can be used. As the ST-NV, the configuration illustrated in FIG. 3B can be used.

Next, the operation of the flip-flop circuit illustrated in FIG. 7 is described with reference to a timing chart in FIG. 9.

Figure 9:
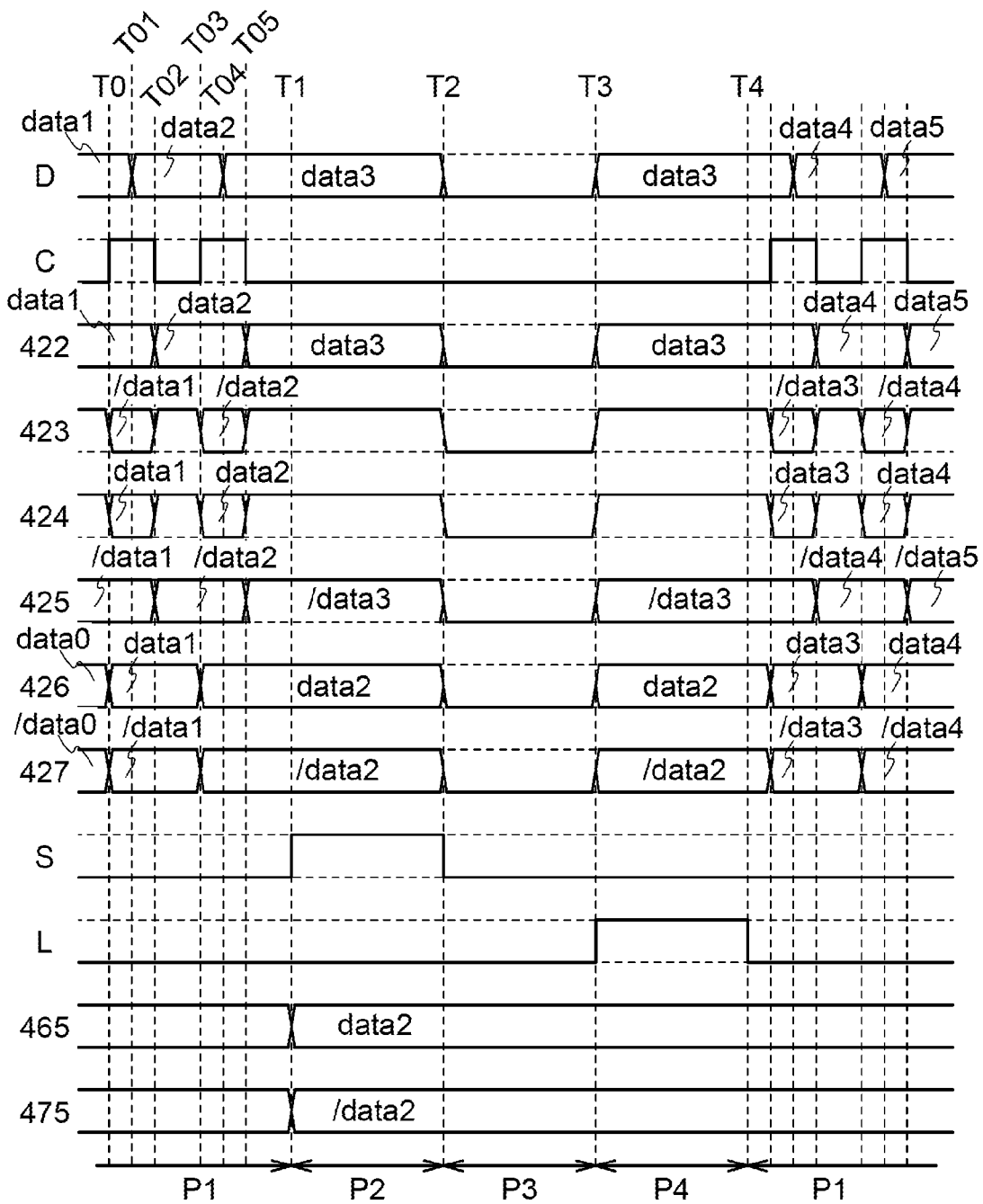
FIG. 9 is a timing chart for a semiconductor device.

In FIG. 9, D denotes the potential of the wiring to which the data signal D is supplied; C denotes the potential of the wiring to which the clock signal C is supplied; S denotes the potential of the wiring to which the control signal Save is supplied; L denotes the potential of the wiring to which the control signal Load is supplied; reference numeral 422 denotes the output potential of the ST-NAND 411; reference numeral 423 denotes the potential of the node 423; reference numeral 424 denotes the potential of the node 424; reference numeral 425 denotes the output potential of the ST-AND 413; reference numeral 426 denotes the potential of the node 426; reference numeral 427 denotes the potential of the node 427; reference numeral 465 denotes the potential of a node 465 where the other of the source and the drain of the transistor 461, the gate of the transistor 463, and the first electrode of the capacitor 464 are electrically connected; and reference numeral 475 denotes the potential of a node 475 where the other of the source and the drain of the transistor 471, the gate of the transistor 473, and the first electrode of the capacitor 474 are electrically connected.

The data signal has a potential at the H level or at the L level, which is denoted by "data1" here. An inverted data value of "data1" is represented with a slash as "/data1."

The timing chart in FIG. 9 shows states of the flip-flop circuit in periods P1 to P4. The period P1 is a normal operation period. The period P2 is a data transfer period. The period P3 is an operation stop period. The period P4 is a transition period for operation restart.

In the timing chart in FIG. 9, times T0 to T4 are added in order to describe the timings of operations in the periods P1 to P4.

Before the time T0, the data signal is data1 and the clock signal is at the L level. At this time, the potentials of the nodes 423 and 424 are at the H level; the potential of the node 421 is /data1; the output potential 422 of the ST-NAND 411 is data1; and the output potential 425 of the ST-AND 413 is /data1. The potential of the node 426 is data0 that has been held before the time T0, and the potential of the node 427 is /data0 that has been held before the time T0.

At the time T0, the clock signal becomes the H level. At this time, the potential of the node 423 becomes /data1, and the potential of the node 424 becomes data1. In addition, the potential of the node 426 becomes data1, and the potential of the node 427 becomes /data1.

At the time T01, the data signal changes from data1 to data2. The potential of the node 421 may change depending on the values of data1 and data2, whereas the output potential 422 of the ST-NAND 411, the potential of the node 423, the potential of the node 424, and the output potential 425 of the ST-AND 413 do not change. Accordingly, the potentials of the nodes 426 and 427 do not change.

At the time T02, the clock signal becomes the L level. At this time, the potentials of the nodes 423 and 424 become the H level, and the potentials of the nodes 426 and 427 are maintained. In addition, the potential of the node 421 becomes /data2; the output potential 422 of the ST-NAND 411 becomes data2; and the output potential 425 of the ST-AND 413 becomes /data2.

At the time T03, the clock signal becomes the H level. At this time, the potential of the node 423 becomes /data2, and the potential of the node 424 becomes data2. In addition, the potential of the node 426 becomes data2, and the potential of the node 427 becomes /data2.

At the time T04, the data signal changes from data2 to data3. The potential of the node 421 may change depending on the values of data2 and data3, whereas the output potential 422 of the ST-NAND 411, the potential of the node 423, the potential of the node 424, and the output potential 425 of the ST-AND 413 do not change. Accordingly, the potentials of the nodes 426 and 427 do not change. In this manner, the first memory circuit portion 400 can hold the value of the data signal at the time when the clock signal changes from the L level to the H level.

At the time T05, the clock signal becomes the L level. At this time, the potentials of the nodes 423 and 424 become the H level, and the potentials of the nodes 426 and 427 are maintained. In addition, the potential of the node 421 becomes /data3; the output potential 422 of the ST-NAND 411 becomes data3; and the output potential 425 of the ST-AND 413 becomes /data3.

At the time T1, the clock signal is fixed at the L level, and the control signal Save becomes the H level. At this time, the latch portion 402 remains in a data holding state; thus, the potential of the node 426 remains data2, and the potential of the node 427 remains /data2. The potential of the node 426 is transmitted to the node 475 through the ST-NV 470, so that the potential of the node 475 becomes /data2. In addition, the potential of the node 427 is transmitted to the node 465 through the ST-INV 460, so that the potential of the node 465 becomes data2. In this manner, the data can be transferred from the first memory circuit portion 400 to the second memory circuit portion 450.

At the time T2, the supply of the power supply voltage is stopped and the control signal Save becomes the L level. At this time, the node 465 and the node 475 are brought into a floating state, where the data are held. In this manner, the second memory circuit portion 450 holds the data, and the first memory circuit portion 400 loses the data.

At the time T3, the supply of the power supply voltage is restarted, so that the control signal Load becomes the H level. At this time, the potential of the node 426 and the potential of the node 427 are determined by a difference in channel resistance between the transistor 473 and the transistor 463. For example, in the case where data2 is at the H level, the node 475 is at the L level and the node 465 is at the H level. At this time, the transistor 473 is off, and the wiring for supplying the potential V1 at the L level and the node 426 are not electrically connected to each other. On the other hand, the transistor 463 is on, and the wiring for supplying the potential V1 at the L level and the node 427 are electrically connected to each other. Thus, the potential of the node 427 is at the L level. The data values of the node 426 and the node 427 are always inverses of each other; therefore, one of the nodes 426 and 427 is always electrically connected to the wiring for supplying the potential V1 at the L level.

When the supply of the power supply voltage is restarted, the potential D of the wiring to which the data signal is supplied returns to data3, and the potential at the L level is supplied to the wiring to which the clock signal is supplied. At this time, the potentials of the nodes 423 and 424 become the H level. In addition, owing to the second memory circuit portion 450, one of the nodes 426 and 427 is at the L level and the other is at the H level. Accordingly, the potential of the node 426 becomes data2 and the potential of the node 427 becomes /data2, so that the data can be restored in the first memory circuit portion 400. In addition, the potential of the node 421 becomes /data3; the output potential 422 of the ST-NAND 411 becomes data3; and the output potential 425 of the ST-AND 413 becomes /data3.

At the time T4, the control signal Load becomes the L level, and the voltage supply from the second memory circuit portion 450 to the first memory circuit portion 400 is stopped. After this, a normal operation period starts, in which data arithmetic operation is performed.

With the above-described configuration, a semiconductor device which can easily achieve a stop and a restart of supply of power supply voltage can be provided. Data storage and restoration are performed with the first memory circuit portion 400 and the second memory circuit portion 450, whereby the supply of power supply voltage can be stopped as appropriate and power consumption can be reduced.

At the time of low voltage driving or at the time when there is large variation in threshold voltage or mobility of transistors due to the manufacturing process, there is a case where the transistor 463 cannot have a sufficient ratio of on-state current to off-state current with respect to a voltage value held at the node 465. Similarly, there is a case where the transistor 473 cannot have a sufficient ratio of on-state current to off-state current with respect to a voltage value held at the node 475.

However, even in such cases, at the time of restart of supply of power supply voltage, a potential difference can be generated between the node 426 and the node 427 owing to the difference in channel resistance between the transistor 473 and the transistor 463; thus, data can be restored.

With the above-described configuration, a semiconductor device which can easily achieve a stop and a restart of supply of power supply voltage, which can be driven at low voltage, and which is resistant to process variations can be provided.

Embodiment 4

In this embodiment, application examples of the semiconductor device are described with specific examples.

Figure 10:
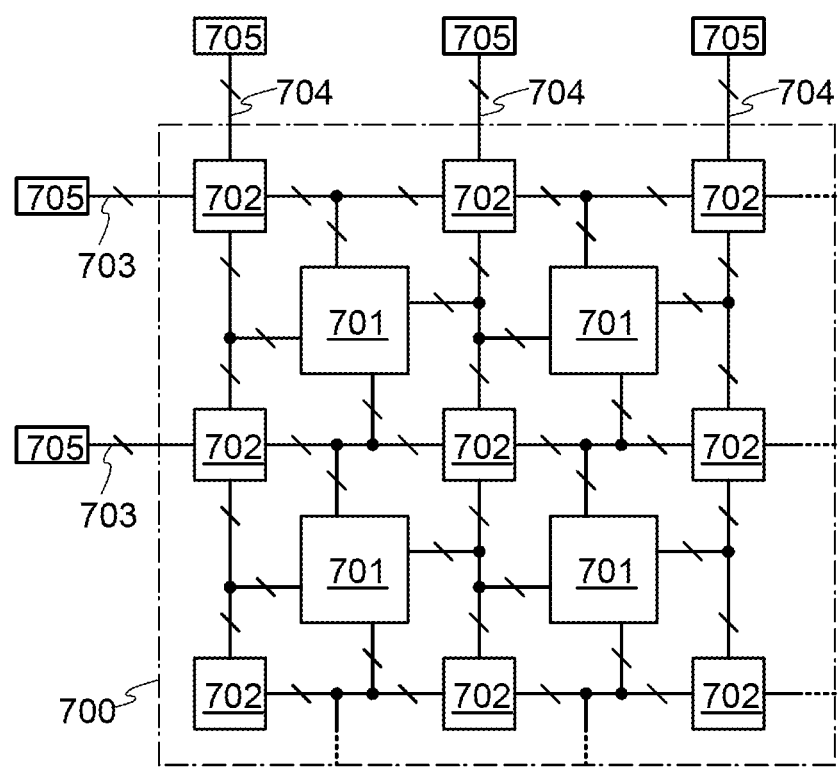
FIG. 10 is a block diagram of a semiconductor device.

FIG. 10 is an example of a block diagram of a logic array included in a PLD. A logic array 700 includes a plurality of logic elements (hereinafter referred to as LEs) 701 arranged in an array. Here, the expression "arranged in an array" means that the logic elements are arranged in a matrix at regular intervals, and the arrangement is not limited to that illustrated in FIG. 10.

A plurality of wirings are formed to surround the LEs 701. In FIG. 10, these wirings consist of a plurality of horizontal wiring groups 703 and a plurality of vertical wiring groups 704. A wiring group is a bundle of a plurality of wirings. A switch portion 702 is provided at an intersection of the horizontal wiring group 703 and the vertical wiring group 704. The horizontal wiring groups 703 and the vertical wiring groups 704 are electrically connected to input and output terminals 705 to transmit and receive signals to and from a circuit provided outside the logic array 700.

Input and output terminals of the plurality of LEs 701 are electrically connected to the horizontal wiring groups 703 and the vertical wiring groups 704 provided around the LEs 701. For example, in FIG. 10, the input and output terminals of the LEs 701 are electrically connected to the horizontal wiring groups 703 and the vertical wiring groups 704 on the left, right, top, and bottom sides. With the use of these input and output terminals, each of the LEs 701 can be electrically connected to another LE 701. A connection path between one LE 701 and another LE 701 is determined by a switch for switching connection between wirings which is provided in the switch portion 702.

Whether the switch for switching connection between wirings in the switch portion 702 is turned on or off is determined in accordance with a configuration memory which stores configuration data. In the case of a rewritable structure, the configuration memory provided in the switch portion 702 preferably includes a nonvolatile memory element to prevent loss of stored configuration data due to a stop of supply of power supply voltage.

Figure 11:
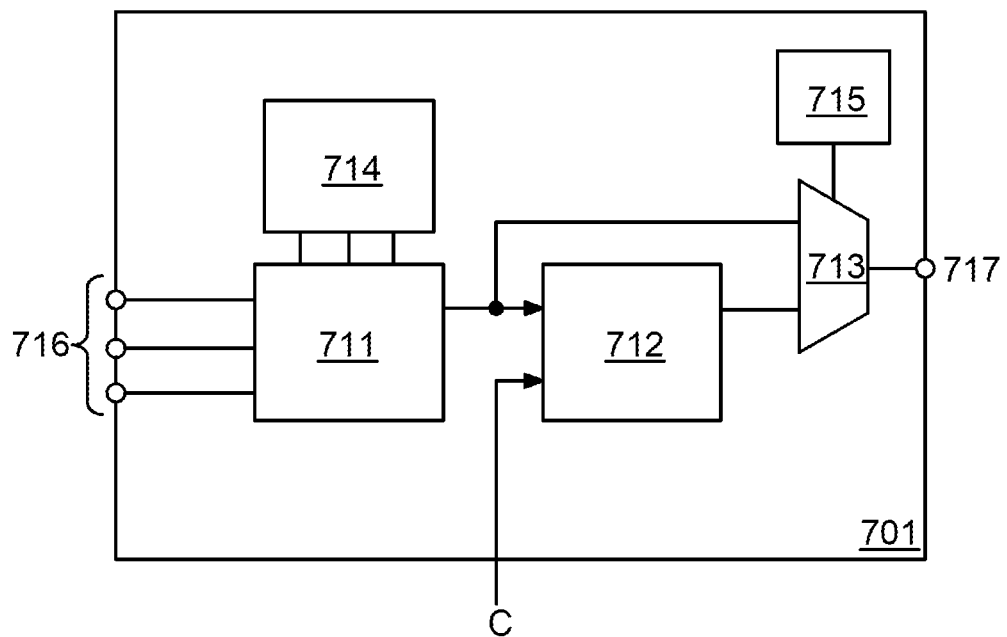
FIG. 11 is a block diagram of a semiconductor device.

FIG. 11 is a block diagram of the LE 701 in FIG. 10. The LE 701 in FIG. 11 includes a lookup table (hereinafter referred to as an LUT) 711, a flip-flop 712, and a multiplexer 713, for example. Further, in FIG. 11, configuration memories 714 and 715 electrically connected to the lookup table 711 and the multiplexer 713, respectively, are provided.

Note that the configuration data refers to data of the LUT 711, information on selection of input signals of the multiplexer 713, and data on whether the switch portion 702 is conductive or not, for example. The configuration memory refers to a memory element for storing the configuration data.

A logic circuit determined by the LUT 711 varies depending on the content of configuration data stored in the configuration memory 714. When the configuration data is determined, one output value of the LUT 711 with respect to input values of a plurality of input signals supplied to input terminals 716 is determined. Then, the LUT 711 outputs a signal containing the output value.

The flip-flop 712 holds the signal output from the LUT 711 and outputs an output signal corresponding to the signal to the multiplexer 713 in synchronization with a clock signal C.

The output signal from the LUT 711 and the output signal from the flip-flop 712 are input to the multiplexer 713. The multiplexer 713 outputs one of the above two output signals in accordance with configuration data stored in the configuration memory 715. The output signal from the multiplexer 713 is output from an output terminal 717.

When the semiconductor device described in the above embodiment is applied to a circuit for temporarily storing data therein, e.g., the flip-flop 712, loss of data in the flip-flop caused by a stop of supply of power supply voltage can be prevented. Further, data held before the stop of the supply of power supply voltage can be backed up in a short time, and the data can be restored in a short time after the supply of power supply voltage is restarted. Accordingly, the supply of power supply voltage can be stopped in a plurality of logic elements included in the PLD. Thus, power consumption of the PLD can be low.

Figure 12A:
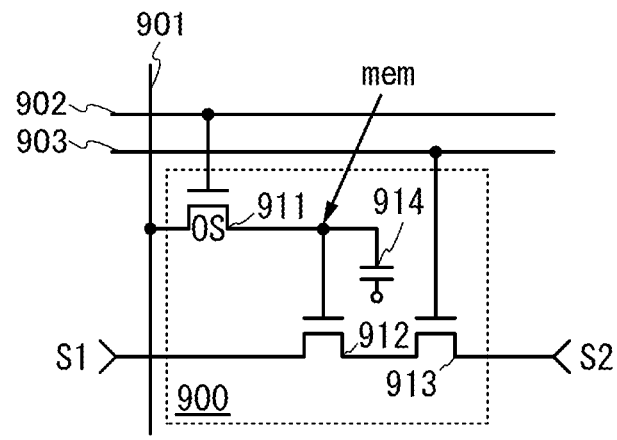
FIGS. 12A and 12B are circuit diagrams of semiconductor devices.

FIG. 12A shows an example of a nonvolatile memory element which can be used as a configuration memory provided in the switch portion 702. The nonvolatile memory element in FIG. 12A has a structure in which a configuration memory is formed using a transistor including an oxide semiconductor. When the nonvolatile memory element used as the configuration memory is configured to hold data by utilizing a small off-state current of the transistor including an oxide semiconductor, the configuration memory can be manufactured through a manufacturing process of the transistor and by stacking the transistors, for example. This is highly advantageous in reducing cost.

FIG. 12A illustrates a configuration memory 900 provided in the switch portion 702, for example. The configuration memory 900 controls connection between a terminal S1 and a terminal S2 in accordance with configuration data held at a node mem.

The configuration memory 900 in FIG. 12A includes a transistor 911, a transistor 912, a transistor 913, and a capacitor 914.

Figure 12B:
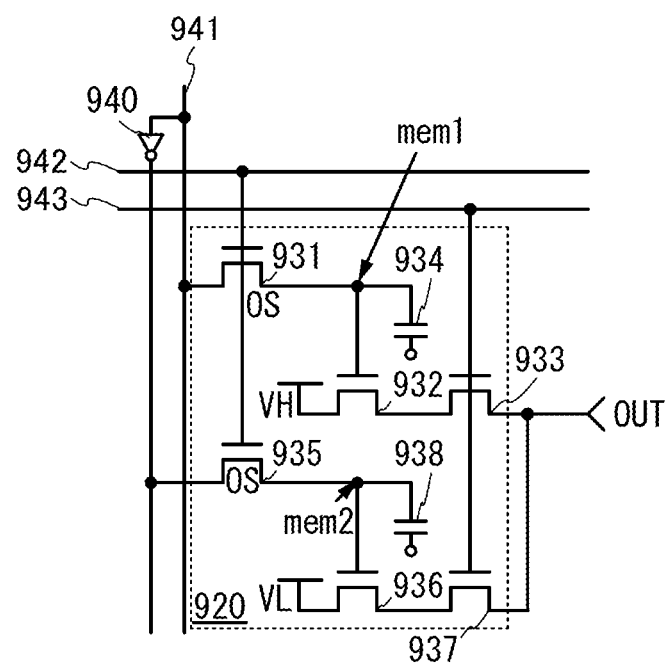

FIG. 12B illustrates a configuration memory 920 that can control the LUT 711 and the multiplexer 713, for example. The configuration memory 920 controls signals of an output terminal OUT in accordance with configuration data held at nodes mem1 and mem2. A potential VH and a potential VL are signals for controlling the LUT 711 or the multiplexer 713.

The configuration memory 920 in FIG. 12B includes a transistor 931, a transistor 932, a transistor 933, a capacitor 934, a transistor 935, a transistor 936, a transistor 937, and a capacitor 938.

For each of the transistor 911, the transistor 931, and the transistor 935, a semiconductor material that has a wider band gap and a lower intrinsic carrier density than silicon is used. For example, a transistor including an oxide semiconductor in a channel formation region is used. On the other hand, each of the transistor 912, the transistor 913, the transistor 932, the transistor 933, the transistor 936, and the transistor 937 may be a transistor which includes a semiconductor material such as silicon in a channel formation region and which is capable of switching at a higher speed than that of the transistor 911, the transistor 931, and the transistor 935.

Note that in the drawings, "OS" is written beside each of the transistor 911, the transistor 931, and the transistor 935 to indicate that each of the transistor 911, the transistor 931, and the transistor 935 includes an oxide semiconductor in the channel formation region.

The details of the configuration memory 900 are described with reference to FIG. 12A. As illustrated in FIG. 12A, a gate of the transistor 911 is electrically connected to a first word line 902. One of a source and a drain of the transistor 911 is electrically connected to a data line 901. The other of the source and the drain of the transistor 911 is electrically connected to a gate of the transistor 912 and the capacitor 914. One of a source and a drain of the transistor 912 is electrically connected to the terminal S1. The other of the source and the drain of the transistor 912 is electrically connected to one of a source and a drain of the transistor 913. A gate of the transistor 913 is electrically connected to a second word line 903. The other of the source and the drain of the transistor 913 is electrically connected to the terminal S2.

In the configuration memory 900 in FIG. 12A, a potential corresponding to an H level or an L level is held at the node mem as configuration data. Configuration data can be stored at the node mem by using a transistor with extremely small off-state current as the transistor 911. In the configuration memory 900, whether the transistor 912 is turned on or off is controlled in accordance with the potential of configuration data. At timing of turning on the transistor 913, electrical connection between the terminal S1 and the terminal S2 can be controlled.

Next, the details of the configuration memory 920 are described with reference to FIG. 12B. As illustrated in FIG. 12B, a gate of the transistor 931 is electrically connected to a first word line 942. One of a source and a drain of the transistor 931 is electrically connected to a data line 941. The other of the source and the drain of the transistor 931 is electrically connected to a gate of the transistor 932 and the capacitor 934. One of a source and a drain of the transistor 932 is electrically connected to a wiring to which the potential VH is supplied. The other of the source and the drain of the transistor 932 is electrically connected to one of a source and a drain of the transistor 933. A gate of the transistor 933 is electrically connected to a second word line 943. The other of the source and the drain of the transistor 933 is electrically connected to the output terminal OUT. A gate of the transistor 935 is electrically connected to the first word line 942. One of a source and a drain of the transistor 935 is electrically connected to the data line 941 through an inverter circuit 940. The other of the source and the drain of the transistor 935 is electrically connected to a gate of the transistor 936 and the capacitor 938. One of a source and a drain of the transistor 936 is electrically connected to a wiring to which the potential VL is supplied. The other of the source and the drain of the transistor 936 is electrically connected to one of a source and a drain of the transistor 937. A gate of the transistor 937 is electrically connected to the second word line 943. The other of the source and the drain of the transistor 937 is electrically connected to the output terminal OUT.

In the configuration memory 920 in FIG. 12B, as configuration data, a potential corresponding to an H level and a potential corresponding to an L level are held at the nodes mem1 and mem2, respectively, or a potential corresponding to an L level and a potential corresponding to an H level are held at the nodes mem1 and mem2, respectively. Configuration data can be stored at the nodes mem1 and mem2 by using a transistor with extremely small off-state current as each of the transistors 931 and 935. In the configuration memory 920, whether each of the transistors 932 and 936 is turned on or off is controlled in accordance with the potential of configuration data. At timing of turning on each of the transistors 933 and 937, a signal output from the output terminal OUT can be set to the potential VH or the potential VL.

FIG. 13 illustrates an example of a block diagram of a CPU.

A CPU 1000 includes a program counter 1011, an instruction register 1012, an instruction decoder 1013, a general-purpose register 1014, and an arithmetic logic unit (ALU) 1015, for example. A main memory device 1001 for inputting and outputting data to and from the CPU 1000 is provided outside the CPU 1000.

The program counter 1011 is a register which stores an address of an instruction (command) to be read (fetched). The instruction register 1012 is a register for temporarily storing data transmitted to the instruction decoder 1013 from the main memory device 1001. The instruction decoder 1013 is a circuit which decodes input data and generates signals for specifying a register in the general-purpose register 1014, a signal for specifying an arithmetic method in the ALU 1015, and the like. The general-purpose register 1014 can store data read from the main memory device 1001, data obtained during the arithmetic operations in the ALU 1015, data obtained as a result of the arithmetic operations of the ALU 1015, or the like. The ALU 1015 has a function of performing a variety of arithmetic operations such as four arithmetic operations and logic operations. In the CPU 1000, a data cache or the like, that is, a circuit which temporarily stores an arithmetic result or the like, may be additionally provided.

Next, the operation of the CPU 1000 will be described.

The CPU 1000 gives an instruction to output an address of a read out instruction which is specified by the program counter 1011 to the main memory device 1001. Next, data, which is stored in the main memory device 1001, is read from an address of the instruction to be carried out and stored in the instruction register 1012.

The instruction decoder 1013 decodes the data stored in the instruction register 1012 and generates signals for performing the instruction. Specifically, the instruction decoder 1013 generates a signal for specifying a register in the general-purpose register 1014, a signal for specifying an arithmetic method in the ALU 1015, and the like.

The general-purpose register 1014 outputs data specified by the instruction decoder 1013 to the ALU 1015 or the main memory device 1001 in accordance with the instruction. In the ALU, arithmetic operations are carried out in accordance with an arithmetic method specified by the instruction decoder 1013, and an arithmetic result is stored in the general-purpose register 1014.

After the CPU 1000 carries out the instruction, the CPU 1000 reads an instruction, decodes data read from the instruction register 1012, and carries out the instruction. The CPU 1000 repeats this operation.

When the semiconductor device described in the above embodiment is applied to registers for temporarily storing data in circuits, such as the program counter 1011, the instruction register 1012, the instruction decoder 1013, and the general-purpose register 1014, loss of data in the registers caused by a stop of the supply of power supply voltage can be prevented. Further, data held before the stop of the supply of power supply voltage can be backed up in a short time, and the data can be restored in a short time after the supply of power supply voltage is restarted. Accordingly, the supply of power supply voltage can be stopped in the entire CPU 1000 or the circuits included in the CPU 1000. Thus, power consumption of the CPU 1000 can be low.

Figure 14:
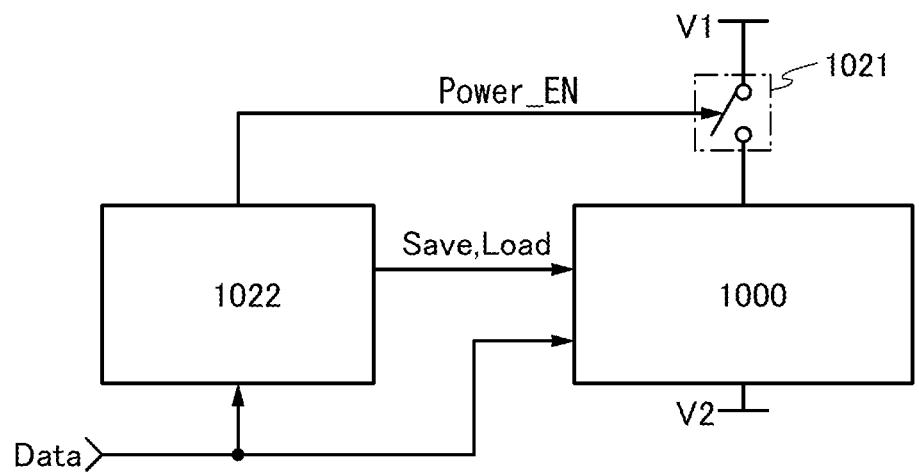
FIG. 14 is a block diagram of a semiconductor device.

FIG. 14 illustrates an example of a configuration for stopping or restarting the supply of power supply voltage to the CPU 1000. In FIG. 14, the CPU 1000, a power switch 1021, and a power supply control circuit 1022 are provided.

The power switch 1021 can control a stop or a restart of the supply of power supply voltage to the CPU 1000 in accordance with its on state or off state. Specifically, the power supply control circuit 1022 outputs a power control signal Power_EN for turning on or off the power switch 1021 to control the stop or the restart of the supply of power supply voltage to the CPU 1000. By turning on the power switch 1021, power supply voltage is supplied to the CPU 1000 through wirings to which the power supply potentials V1 and V2 are supplied. Further, by turning off the power switch 1021, a path of current between the wirings to which the power supply potentials V1 and V2 are supplied is cut, so that the supply of power supply voltage to the CPU 1000 is stopped.

The power supply control circuit 1022 has a function of collectively controlling operations of the power switch 1021 and the CPU 1000 in accordance with the frequency of input of data Data. Specifically, the power supply control circuit 1022 outputs a power control signal Power_EN for turning on or off the power switch 1021 and control signals Save and Load for controlling data backed up and restored in the register. As described above, the control signals Save and Load are signals for backing up and restoring potentials in the registers in the volatile memory circuit portion and the non-volatile memory circuit portion.

Next, an example of operations of the CPU 1000, the power switch 1021, and the power supply control circuit 1022 which are illustrated in FIG. 14 is described.

When the supply of power supply voltage is continued, stopped, or restarted, determination is made in accordance with the frequency of input of data Data to the power supply control circuit 1022. Specifically, in the case where data Data is continuously input to the CPU 1000, the power supply control circuit 1022 outputs the power control signal so that the supply of power supply voltage is continued. In the case where data Data is input to the CPU 1000 intermittently, at timing when the data Data is input, the power supply control circuit 1022 outputs the power control signal so that the supply of power supply voltage is stopped or restarted.

It is preferable that the power supply control circuit 1022 be configured such that power supply voltage is continuously supplied even while the supply of power supply voltage to the CPU 1000 is stopped. With the above configuration, the supply of power supply voltage to the CPU 1000 can be stopped or restarted at desired timing.

Embodiment 5

An oxide semiconductor that can be used for a channel of a transistor will be described in this embodiment.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

A highly purified oxide semiconductor (purified OS) obtained by reduction of impurities such as moisture or hydrogen which serves as an electron donor (donor) and by reduction of oxygen vacancies is an intrinsic (i-type) semiconductor or a substantially i-type semiconductor. Thus, a transistor including a channel in a highly purified oxide semiconductor has extremely low off-state current and high reliability.

Specifically, various experiments can prove low off-state current of a transistor including a channel in a highly purified oxide semiconductor. For example, the off-state current of even an element having a channel width of $1 \times 10^6$ μm and a channel length of 10 μm can be less than or equal to the measurement limit of a semiconductor parameter analyzer, that is, less than or equal to $1 \times 10^{-13}$ A at a voltage between the source electrode and the drain electrode (a drain voltage) of 1 V to 10 V. In this case, it can be seen that off-state current normalized by the channel width of the transistor is less than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor is used for a channel formation region of the transistor, and the off-state current of the transistor is measured from a change in the amount of charge of the capacitor per unit time. As a result, it is found that, in the case where the voltage between the source electrode and the drain electrode of the transistor is 3 V, a lower off-state current of several tens of yA/μm is obtained. Consequently, the off-state current of the transistor in which a highly purified oxide semiconductor is used for a channel formation region is much lower than that of a transistor including crystalline silicon.

Unless otherwise specified, in this specification, the off-state current of an n-channel transistor is a current that flows between a source and a drain when the potential of a gate is lower than or equal to 0 with the potential of the source as a reference potential while the potential of the drain is higher than those of the source and the gate. Moreover, in this specification, the off-state current of a p-channel transistor is a current that flows between a source and a drain when the potential of a gate is higher than or equal to 0 with the potential of the source as a reference potential while the potential of the drain is lower than those of the source and the gate.

The oxide semiconductor preferably contains at least indium (In) or zinc (Zn). In addition, as a stabilizer for reducing the variation in electrical characteristics of a transistor using the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a gallium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide means an oxide containing In, Ga, and Zn, and there is no limitation on the ratio of In:Ga:Zn. In addition, the oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with the In—Sn—Zn-based oxide, a high mobility can be relatively easily obtained. However, mobility can be increased by reducing the defect density in the bulk also in the case of using the In—Ga—Zn-based oxide.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC- OS film, a reduction in electron mobility due to the grain boundary is less likely to occur.

According to a TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (hereinafter, a surface where the CAAC-OS film is formed is also referred to as a formation surface) or a top surface of the CAAC-OS film, and is arranged in parallel to the formation surface or the top surface of the CAAC-OS film.

On the other hand, according to a TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film with a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. Electric charges trapped by the carrier traps in the oxide semiconductor film take a long time to be released, and might behave like fixed electric charges. Thus, the transistor which includes the oxide semiconductor film having high impurity concentration and a high density of defect states has unstable electrical characteristics in some cases.

With use of the CAAC-OS film in a transistor, a variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a boundary between crystal parts is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order in some cases. Note that there is no regularity of atomic arrangement between different crystal parts in the nc-OS film. Thus, there is no regularity of atomic arrangement in the film as a whole. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a beam diameter larger than the size of a crystal part, a peak which shows a crystal plane does not appear in some cases. Further, a halo pattern is shown in some cases in an electron diffraction pattern of the nc-OS film which is obtained by using an electron beam having a beam diameter larger than the size of a crystal part (e.g., a beam diameter of 20 nm$\phi$ or more, or 50 nm$\phi$ or more). Furthermore, spots are shown in some cases in an electron diffraction (referred to as nanobeam electron diffraction) pattern of the nc-OS film obtained by using an electron beam having a beam diameter smaller than or equal to the size of a crystal part (e.g., a beam diameter of 10 nm$\phi$ or less, or 3 nm$\phi$ or less). In a nanobeam electron diffraction pattern of the nc-OS film, for example, regions with high luminance in a circular (or ring-shaped) pattern are shown in some cases. In a nanobeam electron diffraction pattern of the nc-OS film, for example, a plurality of spots is shown in a ring-shaped region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of atomic arrangement between different crystal parts in the nc-OS film. Therefore, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

For example, the CAAC-OS film is formed by a sputtering method with a polycrystalline metal oxide target. When ions collide with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like or pellet-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the flat-plate-like sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powders and the molar ratio for mixing powders may be determined as appropriate depending on the desired target.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor layer is an oxide, Na, among the alkali metals, diffuses into the insulating film and becomes $Na^+$. Further, in the oxide semiconductor layer, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measurement value of a Li concentration is preferably $5 \times 10^{15}/cm^3$ or lower, further preferably $1 \times 10^{15}/cm^3$ or lower. Similarly, the measurement value of a K concentration is preferably $5 \times 10^{15}/cm^3$ or lower, further preferably $1 \times 10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor layer, the electrical characteristics of the transistor are likely to deteriorate as in the case of using an alkali metal or an alkaline earth metal. Thus, the concentrations of silicon and carbon in the oxide semiconductor layer are preferably low. Specifically, the carbon concentration or the silicon concentration measured by secondary ion mass spectrometry is $1 \times 10^{18}/cm^3$ or lower. In this case, the deterioration of the electrical characteristics of the transistor can be prevented, so that the reliability of a semiconductor device can be improved.

A metal in the source electrode and the drain electrode might extract oxygen from the oxide semiconductor layer depending on a conductive material used for the source and drain electrodes. In such a case, a region of the oxide semiconductor layer in contact with the source electrode or the drain electrode becomes an n-type region due to the formation of an oxygen vacancy.

The n-type region serves as a source region or a drain region, resulting in a decrease in the contact resistance between the oxide semiconductor film and the source electrode or the drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source electrode and the drain electrode are formed by a sputtering method or the like or when heat treatment is performed after the formation of the source electrode and the drain electrode.

The n-type region is more likely to be formed when the source and drain electrodes are formed using a conductive material that is easily bonded to oxygen. Examples of such a conductive material include Al, Cr, Cu, Ta, Ti, Mo, and W.

The oxide semiconductor layer is not limited to a single metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose energy at the bottom of the conduction band is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. Further, the second metal oxide film preferably contains at least indium in order to increase the carrier mobility.

In the transistor including the above semiconductor film, when a voltage is applied to the gate electrode so that an electric field is applied to the semiconductor film, a channel region is formed in the second metal oxide film, whose energy at the bottom of the conduction band is the lowest. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, it is preferable that a plurality of metal oxide films be stacked so that an interface level due to impurities existing between the metal oxide films, which inhibits carrier flow, is not formed at the interface between the metal oxide films. This is because if impurities exist between the stacked metal oxide films, the continuity of the energy at the bottom of the conduction band between the metal oxide films is lost, and carriers are trapped or disappear by recombination in the vicinity of the interface. By reducing impurities existing between the films, a continuous junction (here, particularly a U-shape well structure with the energy at the bottom of the conduction band changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering apparatus) provided with a load lock chamber. Each chamber of the sputtering apparatus is preferably evacuated to a high vacuum (less than or equal to $1 \times 10^{-4}$ Pa and more than or equal to $5 \times 10^{-7}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of −40° C. or lower, preferably −80° C. or lower, more preferably −100° C. or lower is used, so that entry of moisture or the like into the oxide semiconductor film can be prevented as much as possible.

For example, the first metal oxide film and/or the third metal oxide film can be an oxide film that contains aluminum, silicon, titanium, gallium, germanium, yttrium, zirconium, tin, lanthanum, cerium, or hafnium at a higher atomic ratio than the second metal oxide film. Specifically, the first metal oxide film and/or the third metal oxide film is preferably an oxide film with a content of any of the above elements 1.5 or more times, preferably 2 or more times, further preferably 3 or more times that of the second metal oxide film in an atomic ratio. The above element is strongly bonded to oxygen and thus has a function of suppressing generation of oxygen vacancies in the oxide film. Accordingly, the first metal oxide film and/or the third metal oxide film can be an oxide film in which oxygen vacancies are less likely to be generated than in the second metal oxide film.

Specifically, when both the second metal oxide film and the first or third metal oxide film are In-M-Zn-based oxide films and the atomic ratio in the first or third metal oxide film is In:M:Zn=$x_1$:$y_1$:$z_1$ and that in the second metal oxide film is In:M:Zn=$x_2$:$y_2$:$z_2$, the atomic ratios are set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. The atomic ratios are preferably set so that $y_1/x_1$ is 1.5 or more times, preferably 2 or more times, further preferably 3 or more times $y_2/x_2$. Here, in the second metal oxide film, $y_2$ is preferably larger than or equal to $x_2$ because the transistor can have stable electrical characteristics. Note that the field-effect mobility of the transistor is reduced when $y_2$ is 3 or more times $x_2$; accordingly, $y_2$ is preferably smaller than 3 times $x_2$.

The thickness of the first metal oxide film and the third metal oxide film is greater than or equal to 3 nm and less than or equal to 100 nm, preferably greater than or equal to 3 nm and less than or equal to 50 nm. The thickness of the second metal oxide film is greater than or equal to 3 nm and less than or equal to 200 nm, preferably greater than or equal to 3 nm and less than or equal to 100 nm, further preferably greater than or equal to 3 nm and less than or equal to 50 nm.

In the three-layer semiconductor film, the first to third metal oxide films can be amorphous or crystalline. Note that the transistor can have stable electrical characteristics when the second metal oxide film where a channel region is formed is crystalline; therefore, the second metal oxide film is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by a sputtering method is used as the first and third metal oxide films, a target that is an In—Ga—Zn-based oxide containing In, Ga, and Zn at an atomic ratio of 1:3:2 can be used to deposit the first and third metal oxide films. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, a target including polycrystalline In—Ga—Zn-based oxide containing In, Ga, and Zn at an atomic ratio of 1:1:1 is preferably used to deposit the second metal oxide film. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portions of the semiconductor film in the transistor may be tapered or rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device. Further, when the semiconductor film including the stacked metal oxide films is used in the transistor, the n-type region particularly preferably reaches the second metal oxide film part of which is to be a channel region, because the mobility and on-state current of the transistor are further increased and higher-speed operation of the semiconductor device is achieved.

This embodiment can be implemented in appropriate combinations with any of the other embodiments.

Embodiment 6

Figure 15:
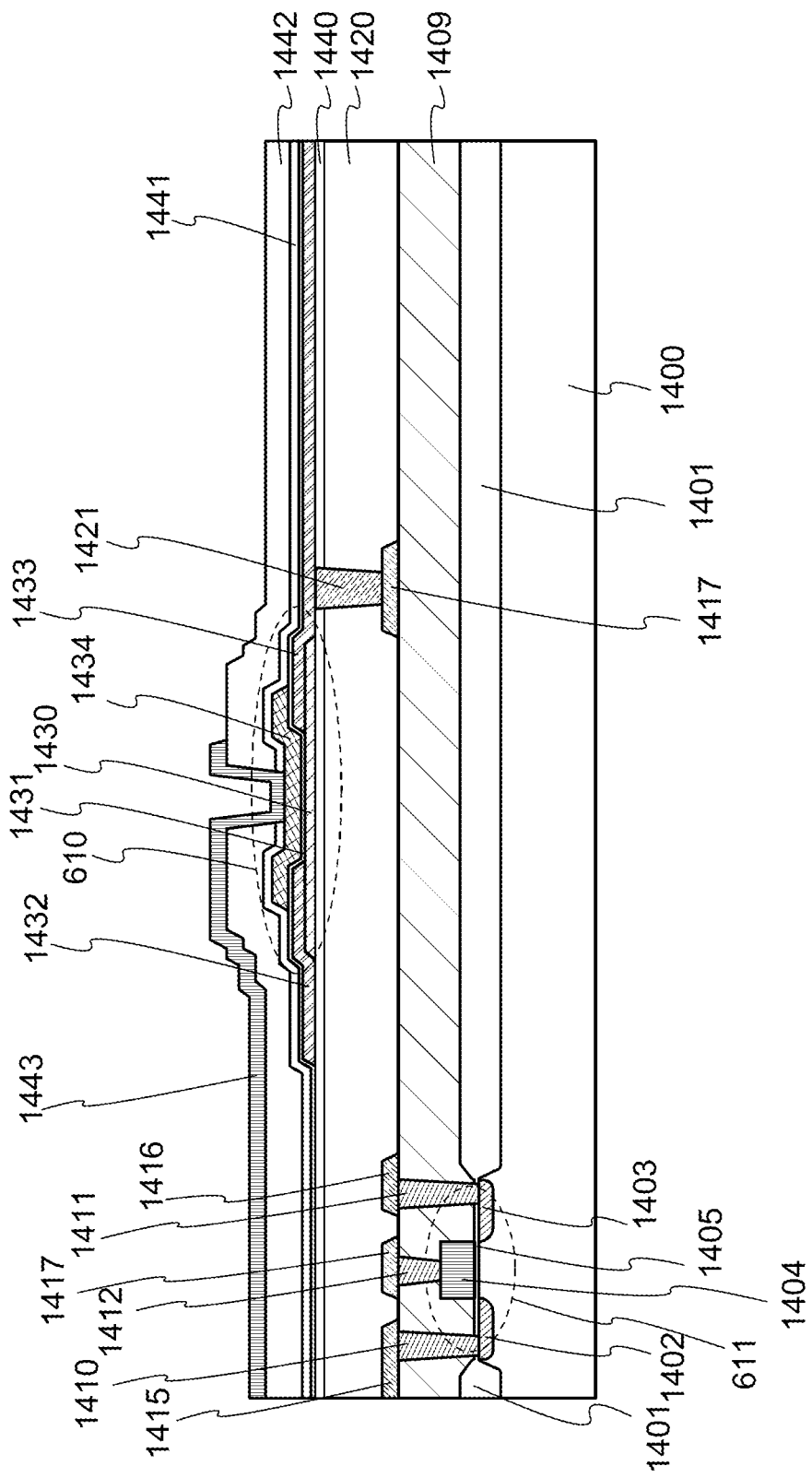
FIG. 15 illustrates an example of a structure of a semiconductor device.

In this embodiment, an example of a semiconductor device will be described. FIG. 15 illustrates an example of a cross-sectional structure of a transistor 610 and a transistor 611 included in the semiconductor device illustrated in FIG. 1, 5, or 7.

A channel of the transistor 610 is included in an oxide semiconductor layer. FIG. 15 shows the case where the transistor 610 is formed over the transistor 611 that has a channel formation region in a single crystal silicon substrate.

Note that an active layer in the transistor 611 can be an amorphous, microcrystalline, polycrystalline, or single crystal semiconductor film of silicon, germanium, or the like. Alternatively, the transistor 611 may include an active layer containing an oxide semiconductor. In the case where all of the transistors include an active layer containing an oxide semiconductor, the transistor 610 is not necessarily stacked over the transistor 611, and the transistors 610 and 611 may be formed in the same layer.

When the transistor 611 is formed using a thin silicon film, any of the following can be used, for example: amorphous silicon formed by a sputtering method or a vapor phase growth method such as a plasma-enhanced CVD method, polycrystalline silicon obtained by crystallization of amorphous silicon by laser irradiation, and single crystal silicon obtained by separation of a surface portion of a single crystal silicon wafer by implantation of hydrogen ions or the like into the silicon wafer.

Examples of a semiconductor substrate 1400 where the transistor 611 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). As an example, FIG. 15 shows the case where an n-type single crystal silicon substrate is used.

The transistor 611 is electrically isolated from other transistors by an element isolation insulating film 1401. The element isolation insulating film 1401 can be formed by local oxidation of silicon (LOCOS), trench isolation, or the like.

Specifically, the transistor 611 includes impurity regions 1402 and 1403 that are formed in the semiconductor substrate 1400 and function as source and drain regions, a gate electrode 1404, and a gate insulating film 1405 between the semiconductor substrate 1400 and the gate electrode 1404. The gate electrode 1404 overlaps with a channel formation region formed between the impurity regions 1402 and 1403, with the gate insulating film 1405 placed therebetween.

An insulating film 1409 is provided over the transistor 611. Openings are formed in the insulating film 1409. A wiring 1410 in contact with the impurity region 1402, a wiring 1411 in contact with the impurity region 1403, and a wiring 1412 electrically connected to the gate electrode 1404 are formed in the openings.

The wiring 1410 is electrically connected to a wiring 1415 over the insulating film 1409. The wiring 1411 is electrically connected to a wiring 1416 over the insulating film 1409. The wiring 1412 is electrically connected to a wiring 1417 over the insulating film 1409.

An insulating film 1420 and an insulating film 1440 are formed to be stacked in this order over the wirings 1415 to 1417. An opening is formed in the insulating films 1420 and 1440. A wiring 1421 electrically connected to the wiring 1417 is formed in the opening.

In FIG. 15, the transistor 610 is formed over the insulating film 1440.

The transistor 610 includes, over the insulating film 1440, a semiconductor film 1430 containing an oxide semiconductor; conductive films 1432 and 1433 that function as source and drain electrodes and are provided over the semiconductor film 1430; a gate insulating film 1431 over the semiconductor film 1430 and the conductive films 1432 and 1433; and a gate electrode 1434 that is provided over the gate insulating film 1431 and overlaps with the semiconductor film 1430 in the region between the conductive films 1432 and 1433. Note that the conductive film 1433 is electrically connected to the wiring 1421.

An insulating film 1441 and an insulating film 1442 are formed to be stacked in this order over the transistor 610. An opening is formed in the insulating films 1441 and 1442. A conductive film 1443 that is in contact with the gate electrode 1434 in the opening is provided over the insulating film 1441.

In FIG. 15, the transistor 610 includes the gate electrode 1434 on at least one side of the semiconductor film 1430. Alternatively, the transistor 610 may include a pair of gate electrodes with the semiconductor film 1430 placed therebetween.

In the case where the transistor 610 has a pair of gate electrodes with the semiconductor film 1430 therebetween, one of the gate electrodes may be supplied with a signal for controlling whether to turn on or off the transistor 610, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 15, the transistor 610 has a single-gate structure in which one channel formation region corresponding to one gate electrode 1434 is provided. Alternatively, the transistor 610 may have a multi-gate structure in which a plurality of gate electrodes electrically connected to each other are provided and thus a plurality of channel formation regions are included in one active layer.

Figure 16A:
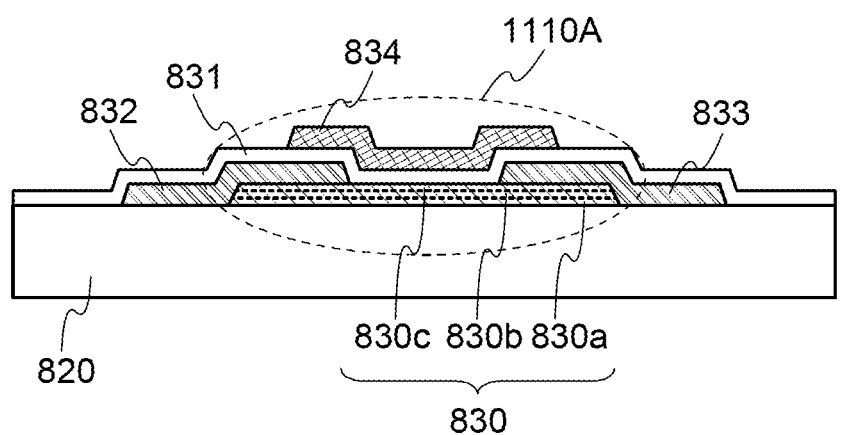
FIGS. 16A and 16B each illustrate an example of a structure of a semiconductor device.

The semiconductor film 1430 is not limited to a single film of an oxide semiconductor and may be a stack including a plurality of oxide semiconductor films. FIG. 16A illustrates a structural example of a transistor 1110A in which the semiconductor film 1430 has a three-layer structure.

The transistor 1110A illustrated in FIG. 16A includes the semiconductor film 830 over an insulating film 820 or the like, conductive films 832 and 833 electrically connected to the semiconductor film 830, a gate insulating film 831, and a gate electrode 834 provided over the gate insulating film 831 so as to overlap with the semiconductor film 830.

In the transistor 1110A, as the semiconductor film 830, oxide semiconductor layers 830a to 830c are stacked in this order from the insulating film 820 side.

The oxide semiconductor layers 830a and 830c are each an oxide film that contains at least one of metal elements contained in the oxide semiconductor layer 830b. The energy at the bottom of the conduction band of the oxide semiconductor layers 830a and 830c is closer to a vacuum level than that of the oxide semiconductor layer 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830b preferably contains at least indium in order to increase carrier mobility.

Figure 16B:
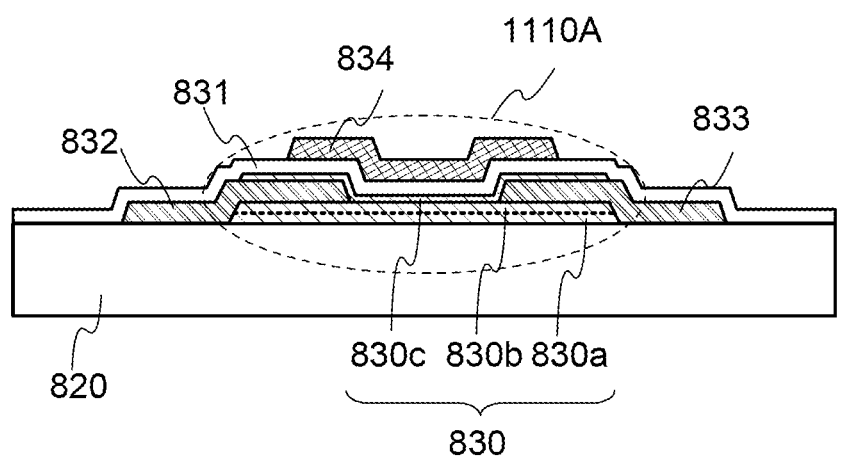

As illustrated in FIG. 16B, the oxide semiconductor layer 830c overlapping with the gate insulating film 831 may be partly provided over the conductive films 832 and 833.

Embodiment 7

The semiconductor device according to an embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can use the semiconductor device according to an embodiment of the present invention, mobile phones, game machines including portable game machines, portable information terminals, electronic books, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 17A to 17F.

Figure 17A:
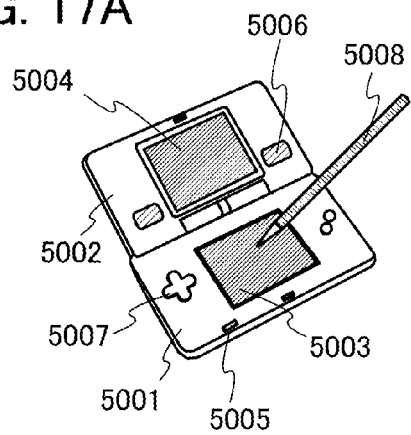
FIGS. 17A to 17F illustrate examples of electronic devices.

FIG. 17A illustrates a portable game machine including a housing 5001, a housing 5002, a display portion 5003, a display portion 5004, a microphone 5005, speakers 5006, an operation key 5007, a stylus 5008, and the like. Although the portable game machine illustrated in FIG. 17A has the two display portions 5003 and 5004, the number of display portions included in the portable game machine is not limited to this.

Figure 17B:
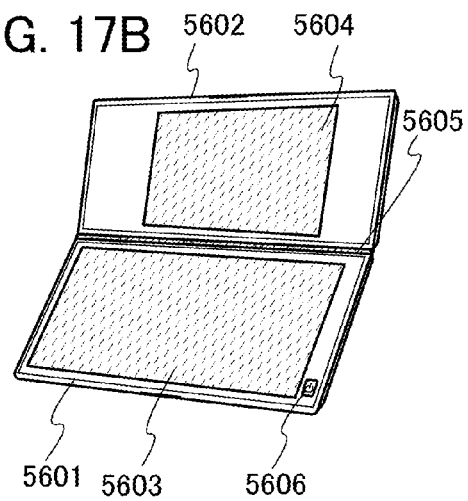

FIG. 17B illustrates a portable information terminal including a housing 5601, a housing 5602, a display portion 5603, a display portion 5604, a joint 5605, an operation key 5606, and the like. The display portion 5603 is provided in the housing 5601, and the display portion 5604 is provided in the housing 5602. The housing 5601 and the housing 5602 are connected to each other with the joint 5605, and the angle between the housing 5601 and the housing 5602 can be changed with the joint 5605. Images displayed on the display portion 5603 may be switched in accordance with the angle at the joint 5605 between the housing 5601 and the housing 5602. A display device with a position input function may be used as at least one of the display portion 5603 and the display portion 5604. Note that the position input function can be added by providing a touch panel in a display device. Alternatively, the position input function can be added by providing a photoelectric conversion element called a photosensor in a pixel area of a display device.

Figure 17C:
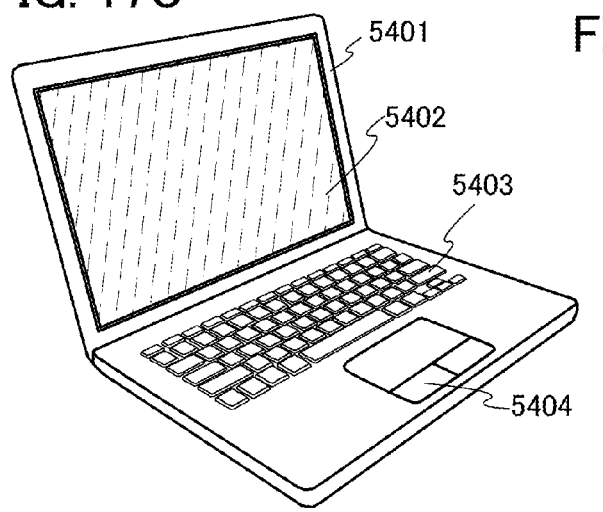

FIG. 17C illustrates a notebook type personal computer including a housing 5401, a display portion 5402, a keyboard 5403, a pointing device 5404, and the like.

Figure 17D:
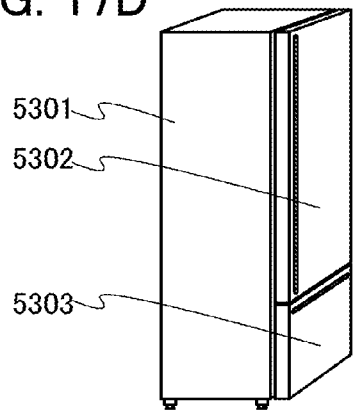

FIG. 17D illustrates an electric refrigerator-freezer including a housing 5301, a refrigerator door 5302, a freezer door 5303, and the like.

Figure 17E:
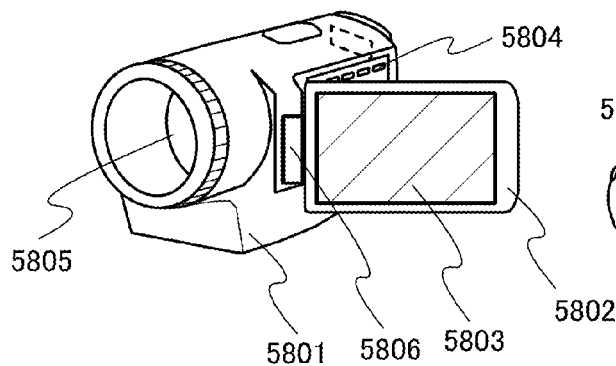

FIG. 17E illustrates a video camera including a housing 5801, a housing 5802, a display portion 5803, operation keys 5804, a lens 5805, a joint 5806, and the like. The operation keys 5804 and the lens 5805 are provided in the housing 5801, and the display portion 5803 is provided in the housing 5802. The housing 5801 and the housing 5802 are connected to each other with the joint 5806, and the angle between the housing 5801 and the housing 5802 can be changed with the joint 5806. Images displayed on the display portion 5803 may be switched in accordance with the angle at the joint 5806 between the housing 5801 and the housing 5802.

Figure 17F:
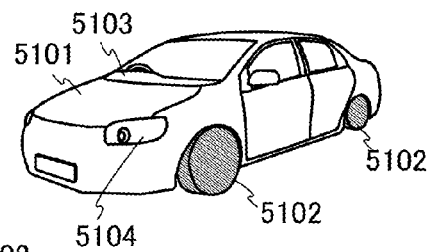

FIG. 17F illustrates a passenger car including a car body 5101, wheels 5102, a dashboard 5103, lights 5104, and the like.

This embodiment can be implemented in appropriate combinations with any of the other embodiments.

EXPLANATION OF REFERENCE

100: first memory circuit portion, 101: gate portion, 102: latch portion, 110: ST-NAND, 111: ST-NAND, 112: ST-NAND, 113: ST-NAND, 116: node, 117: node, 150: second memory circuit portion, 151: first block, 152: second block, 160: ST-NV, 161: transistor, 162: transistor, 163: transistor, 164: capacitor, 165: node, 170: ST-NV, 171: transistor, 172: transistor, 173: transistor, 174: capacitor, 175: node, 200: wiring, 201: wiring, 202: wiring, 203: ST-NAND, 210: transistor, 211: transistor, 212: transistor, 213: transistor, 214: transistor, 215: transistor, 216: transistor, 217: transistor, 218:

transistor, 219: transistor, 250: wiring, 251: wiring, 252: wiring, 253: ST-AND, 300: wiring, 301: wiring, 302: ST-NV, 310: transistor, 311: transistor, 312: transistor, 313: transistor, 314: transistor, 315: transistor, 400: first memory circuit portion, 401: gate portion, 402: latch portion, 410: ST-NAND, 411: ST-NAND, 412: ST-NAND, 413: ST-AND, 414: ST-NAND, 415: ST-NAND, 416: ST-NAND, 421: node, 423: node, 424: node, 426: node, 427: node, 450: second memory circuit portion, 451: first block, 452: second block, 460: ST-NV, 461: transistor, 462: transistor, 463: transistor, 464: capacitor, 465: node, 470: ST-INV, 471: transistor, 472: transistor, 473: transistor, 474: capacitor, 475: node, 500: first memory circuit portion, 501: gate portion, 502: master latch, 503: gate portion, 504: slave latch, 510: ST-NAND, 511: ST-NAND, 512: ST-NAND, 513: ST-NAND, 516: node, 517: node, 530: ST-NAND, 531: ST-NAND, 532: ST-NAND, 533: ST-NAND, 536: node, 537: node, 550: second memory circuit portion, 551: first block, 552: second block, 553: third block, 554: fourth block, 560: ST-NV, 561: transistor, 562: transistor, 563: transistor, 564: capacitor, 565: node, 570: ST-NV, 571: transistor, 572: transistor, 573: transistor, 574: capacitor, 575: node, 580: ST-NV, 581: transistor, 582: transistor, 583: transistor, 584: capacitor, 585: node, 590: ST-NV, 591: transistor, 592: transistor, 593: transistor, 594: capacitor, 595: node, 610: transistor, 611: transistor, 700: logic array, 701: LE, 702: switch portion, 703: wiring group, 704: wiring group, 705: input and output terminal, 711: LUT, 712: flip-flop, 713: multiplexer, 714: configuration memory, 715: configuration memory, 716: input terminal, 717: output terminal, 820: insulating film, 830: semiconductor film, 830a: oxide semiconductor layer, 830b: oxide semiconductor layer, 830c: oxide semiconductor layer, 831: gate insulating film, 832: conductive film, 833: conductive film, 834: gate electrode, 900: configuration memory, 901: data line, 902: word line, 903: word line, 911: transistor, 912: transistor, 913: transistor, 914: capacitor, 920: configuration memory, 931: transistor, 932: transistor, 933: transistor, 934: capacitor, 935: transistor, 936: transistor, 937: transistor, 938: capacitor, 940: inverter circuit, 941: data line, 942: word line, 943: word line, 1000: CPU, 1001: main memory device, 1011: program counter, 1012: instruction register, 1013: instruction decoder, 1014: general-use register, 1015: ALU, 1021: power switch, 1022: power supply control circuit, 1110A: transistor, 1400: semiconductor substrate, 1401: element isolation insulating film, 1402: impurity region, 1403: impurity region, 1404: gate electrode, 1405: gate insulating film, 1409: insulating film, 1410: wiring, 1411: wiring, 1412: wiring, 1415: wiring, 1416: wiring, 1417: wiring, 1420: insulating film, 1421: wiring, 1430: semiconductor film, 1431: gate insulating film, 1432: conductive film, 1433: conductive film, 1434: gate electrode, 1440: insulating film, 1441: insulating film, 1442: insulating film, 1443: conductive film, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, and 5806: joint.

This application is based on Japanese Patent Application serial no. 2013-061969 filed with Japan Patent Office on Mar. 25, 2013, the entire contents of which are hereby incorporated by reference.

The invention claimed is:

1. A semiconductor device comprising:
a memory circuit portion;
a Schmitt trigger inverter;
a first transistor;
a second transistor;
a third transistor; and
a capacitor,
wherein an input terminal of the Schmitt trigger inverter and one of a source and a drain of the first transistor are electrically connected to the memory circuit portion,
wherein an output terminal of the Schmitt trigger inverter is electrically connected to one of a source and a drain of the second transistor,
wherein the other of the source and the drain of the second transistor, a first electrode of the capacitor, and a gate of the third transistor are electrically connected to one another,
wherein a second electrode of the capacitor and one of a source and a drain of the third transistor are electrically connected to a wiring, and
wherein the other of the source and the drain of the third transistor is electrically connected to the other of the source and the drain of the first transistor.

2. The semiconductor device according to claim 1,
wherein the memory circuit portion comprises a latch circuit, and
wherein the latch circuit comprises a Schmitt trigger NAND circuit.

3. The semiconductor device according to claim 1,
wherein the memory circuit portion comprises a flip-flop circuit, and
wherein the flip-flop circuit comprises a Schmitt trigger NAND circuit.

4. The semiconductor device according to claim 1, wherein the second transistor comprises an oxide semiconductor.

5. The semiconductor device according to claim 4, wherein each of the first transistor and the third transistor comprises a semiconductor material other than the oxide semiconductor.

6. A semiconductor device comprising:
a latch circuit comprising a first node and a second node; and
a circuit comprising a first block and a second block,
wherein each of the first block and the second block comprises:
a Schmitt trigger inverter;
a first transistor;
a second transistor;
a third transistor;
a capacitor; and
a third node where one of a source and a drain of the second transistor, a first electrode of the capacitor, and a gate of the third transistor are electrically connected to one another,
wherein an output terminal of the Schmitt trigger inverter is electrically connected to the other of the source and the drain of the second transistor,
wherein a second electrode of the capacitor and one of a source and a drain of the third transistor are electrically connected to a first wiring, and
wherein the other of the source and the drain of the third transistor is electrically connected to one of a source and a drain of the first transistor,
wherein an input terminal of the Schmitt trigger inverter and the other of the source and the drain of the first transistor in the first block are electrically connected to the first node, and wherein an input terminal of the Schmitt trigger inverter and the other of the source and the drain of the first transistor in the second block are electrically connected to the second node.

7. The semiconductor device according to claim 6, further comprising:
a second wiring electrically connected to a gate of the first transistor in each of the first block and the second block, and
a third wiring electrically connected to a gate of the third transistor in each of the first block and the second block.

8. The semiconductor device according to claim 6,
wherein the latch circuit is configured to hold one of a first potential and a second potential at the first node and the other of the first potential and the second potential at the second node in a period when a supply of a power supply voltage is continued, and
wherein the circuit is configured to hold the other of the first potential and the second potential at the third node in the first block and the one of the first potential and the second potential at the third node in the second block in a period when the supply of the power supply voltage is stopped.

9. The semiconductor device according to claim 6, wherein the latch circuit comprises a Schmitt trigger NAND circuit.

10. The semiconductor device according to claim 6, wherein the second transistor comprises an oxide semiconductor.

11. The semiconductor device according to claim 10, wherein each of the first transistor and the third transistor comprises a semiconductor material other than the oxide semiconductor.

12. A semiconductor device comprising:
a flip-flop circuit comprising a first node and a second node; and
a circuit comprising a first block and a second block,
wherein each of the first block and the second block comprises:
a Schmitt trigger inverter;
a first transistor;
a second transistor;
a third transistor;
a capacitor; and
a third node where one of a source and a drain of the second transistor, a first electrode of the capacitor, and a gate of the third transistor are electrically connected to one another,
wherein an output terminal of the Schmitt trigger inverter is electrically connected to the other of the source and the drain of the second transistor,
wherein a second electrode of the capacitor and one of a source and a drain of the third transistor are electrically connected to a first wiring, and
wherein the other of the source and the drain of the third transistor is electrically connected to one of a source and a drain of the first transistor,
wherein an input terminal of the Schmitt trigger inverter and the other of the source and the drain of the first transistor in the first block are electrically connected to the first node, and
wherein an input terminal of the Schmitt trigger inverter and the other of the source and the drain of the first transistor in the second block are electrically connected to the second node.

13. The semiconductor device according to claim 12, further comprising:
a second wiring electrically connected to a gate of the first transistor in each of the first block and the second block, and
a third wiring electrically connected to a gate of the third transistor in each of the first block and the second block.

14. The semiconductor device according to claim 12,
wherein the flip-flop circuit is configured to hold one of a first potential and a second potential at the first node and the other of the first potential and the second potential at the second node in a period when a supply of a power supply voltage is continued, and
wherein the circuit is configured to hold the other of the first potential and the second potential at the third node in the first block and the one of the first potential and the second potential at the third node in the second block in a period when the supply of the power supply voltage is stopped.

15. The semiconductor device according to claim 12, wherein the flip-flop circuit comprises a Schmitt trigger NAND circuit.

16. The semiconductor device according to claim 15, wherein the flip-flop circuit further comprises a Schmitt trigger AND circuit.

17. The semiconductor device according to claim 12, wherein the second transistor comprises an oxide semiconductor.

18. The semiconductor device according to claim 17, wherein each of the first transistor and the third transistor comprises a semiconductor material other than the oxide semiconductor.

* * * * *